United States Patent
Tatum et al.

(10) Patent No.: US 8,233,805 B2
(45) Date of Patent: Jul. 31, 2012

(54) LASER DRIVERS FOR CLOSED PATH OPTICAL CABLES

(75) Inventors: Jimmy A. Tatum, Plano, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/979,243

(22) Filed: Dec. 27, 2010

(65) Prior Publication Data

US 2011/0091219 A1 Apr. 21, 2011

Related U.S. Application Data

(63) Continuation of application No. 11/470,623, filed on Sep. 6, 2006, now Pat. No. 7,860,398.

(60) Provisional application No. 60/717,352, filed on Sep. 15, 2005.

(51) Int. Cl.
*H04B 10/00* (2006.01)

(52) U.S. Cl. ......... 398/141; 398/140; 398/139; 398/110

(58) Field of Classification Search ........... 398/139–141
See application file for complete search history.

(56) References Cited

U.S. PATENT DOCUMENTS

| | | | |
|---|---|---|---|
| 3,663,822 A | | 5/1972 | Uchida |
| 3,792,284 A | * | 2/1974 | Kaelin .......................... 250/551 |
| 4,127,862 A | * | 11/1978 | Ilegems et al. ................ 257/184 |
| 4,427,879 A | | 1/1984 | Becher et al. |
| 4,595,839 A | * | 6/1986 | Braun et al. ................... 250/551 |
| 4,768,188 A | | 8/1988 | Barnhart et al. |
| 4,902,092 A | | 2/1990 | Grandy |
| 5,064,299 A | * | 11/1991 | Hirschmann et al. ........... 385/33 |
| 5,166,761 A | * | 11/1992 | Olson et al. ...................... 257/46 |
| 5,303,251 A | * | 4/1994 | Zelenka ..................... 372/38.02 |
| 5,337,398 A | | 8/1994 | Benzoni et al. |
| 5,341,086 A | * | 8/1994 | Fukudome ..................... 323/273 |
| 5,448,661 A | * | 9/1995 | Takai et al. ...................... 385/24 |
| 5,451,767 A | * | 9/1995 | Amano et al. .............. 250/214.1 |
| 5,497,187 A | | 3/1996 | Banker et al. |
| 5,515,467 A | | 5/1996 | Webb |
| 5,530,787 A | | 6/1996 | Arnett |

(Continued)

FOREIGN PATENT DOCUMENTS

JP 07-210644 8/1995

(Continued)

OTHER PUBLICATIONS

PCT/US2006/034110, Jul. 17, 2007, Int'l Search Report.

(Continued)

*Primary Examiner* — Agustin Bello
(74) *Attorney, Agent, or Firm* — Maschoff Gilmore & Israelsen

(57) ABSTRACT

Simplified laser drivers for closed path digital optical cables and digital optical cables including the simplified laser drivers. The laser driver can include less transistors than conventional laser drivers for optical communication cables. The laser can include a bias source and modulation source. The bias source can have a single constant current bias point for all laser diodes. The modulation current source can have a single temperature coefficient for all laser diodes. The laser driver can exclude, for example, any one of or combination of temperature compensation of the modulation or bias current sources, external programming of the modulation or bias current sources, power control based on output of the laser diode, and/or control based on feedback received from a monitor device or other sensor within the cables.

20 Claims, 13 Drawing Sheets

U.S. PATENT DOCUMENTS

| | | | |
|---|---|---|---|
| 5,631,988 A | 5/1997 | Swirhun et al. | |
| 5,668,419 A | 9/1997 | Oktay | |
| 5,732,176 A | 3/1998 | Savage, Jr. | |
| 5,892,784 A * | 4/1999 | Tan et al. | 372/50.21 |
| 5,907,569 A * | 5/1999 | Glance et al. | 372/29.021 |
| 5,926,303 A | 7/1999 | Giebel et al. | |
| 6,008,917 A * | 12/1999 | Moise et al. | 398/41 |
| 6,036,654 A | 3/2000 | Quinn et al. | |
| 6,115,516 A | 9/2000 | Watson et al. | |
| 6,179,627 B1 | 1/2001 | Daly et al. | |
| 6,217,231 B1 | 4/2001 | Mesaki et al. | |
| 6,220,873 B1 | 4/2001 | Samela et al. | |
| 6,267,606 B1 | 7/2001 | Poplawski et al. | |
| 6,441,955 B1 | 8/2002 | Takatsu et al. | |
| 6,446,867 B1 * | 9/2002 | Sanchez | 235/454 |
| 6,458,619 B1 | 10/2002 | Irissou | |
| 6,461,059 B2 | 10/2002 | Ando et al. | |
| 6,478,625 B2 | 11/2002 | Tolmie et al. | |
| 6,502,997 B1 | 1/2003 | Lee et al. | |
| 6,515,308 B1 | 2/2003 | Kneiss et al. | |
| 6,539,147 B1 | 3/2003 | Mahony | |
| 6,540,412 B2 | 4/2003 | Yonemura et al. | |
| 6,553,166 B1 * | 4/2003 | Caldwell | 385/100 |
| 6,580,739 B1 * | 6/2003 | Coldren | 372/50.21 |
| 6,588,942 B1 | 7/2003 | Weld et al. | |
| 6,607,307 B2 | 8/2003 | Gilliland et al. | |
| 6,717,972 B2 * | 4/2004 | Steinle et al. | 372/50.21 |
| 6,755,575 B2 | 6/2004 | Kronlund et al. | |
| 6,758,693 B2 | 7/2004 | Inagaki et al. | |
| 6,774,348 B2 | 8/2004 | Tatum et al. | |
| 6,793,539 B1 | 9/2004 | Lee et al. | |
| 6,806,114 B1 * | 10/2004 | Lo | 438/36 |
| 6,819,568 B2 | 11/2004 | Cao | |
| 6,822,987 B2 * | 11/2004 | Diaz et al. | 372/38.02 |
| 6,851,867 B2 | 2/2005 | Pang et al. | |
| 6,905,257 B2 | 6/2005 | Eichenberger et al. | |
| 6,912,361 B2 | 6/2005 | Aronson et al. | |
| 6,914,637 B1 * | 7/2005 | Wolf et al. | 348/473 |
| 6,920,161 B2 * | 7/2005 | Riaziat et al. | 372/36 |
| 6,941,395 B1 | 9/2005 | Galang et al. | |
| 6,952,395 B1 | 10/2005 | Manoharan et al. | |
| 6,954,592 B2 * | 10/2005 | Tan et al. | 398/138 |
| 6,965,722 B1 | 11/2005 | Nguyen | |
| 7,062,171 B2 | 6/2006 | Ota et al. | |
| 7,065,604 B2 * | 6/2006 | Konda et al. | 710/315 |
| 7,070,425 B2 | 7/2006 | Regen et al. | |
| 7,088,518 B2 | 8/2006 | Tatum et al. | |
| 7,153,039 B2 | 12/2006 | McGarvey et al. | |
| 7,154,921 B2 * | 12/2006 | Kitamura et al. | 372/26 |
| 7,162,130 B2 | 1/2007 | Castellani et al. | |
| 7,170,097 B2 * | 1/2007 | Edmond et al. | 257/77 |
| 7,179,329 B2 * | 2/2007 | Boone et al. | 117/2 |
| 7,217,022 B2 | 5/2007 | Ruffin | |
| 7,269,194 B2 * | 9/2007 | Diaz et al. | 372/38.02 |
| 7,269,673 B2 | 9/2007 | Kim et al. | |
| 7,277,620 B2 | 10/2007 | Vongseng et al. | |
| 7,294,868 B2 * | 11/2007 | Debray et al. | 257/104 |
| 7,309,173 B2 | 12/2007 | Epitaux et al. | |
| 7,327,959 B2 | 2/2008 | Pelletier et al. | |
| 7,371,014 B2 | 5/2008 | Willis et al. | |
| 7,373,069 B2 | 5/2008 | Lazo | |
| 7,401,985 B2 | 7/2008 | Aronson et al. | |
| 7,445,389 B2 | 11/2008 | Aronson | |
| 7,496,161 B2 | 2/2009 | Chou et al. | |
| 7,499,616 B2 | 3/2009 | Aronson et al. | |
| 7,548,675 B2 | 6/2009 | Tatum et al. | |
| 7,729,618 B2 | 6/2010 | Tatum et al. | |
| 2001/0035994 A1 | 11/2001 | Agazzi et al. | |
| 2002/0006251 A1 | 1/2002 | Kim et al. | |
| 2002/0018609 A1 | 2/2002 | Schumann | |
| 2002/0044746 A1 | 4/2002 | Kronlund et al. | |
| 2002/0049879 A1 * | 4/2002 | Eyer | 710/305 |
| 2002/0063935 A1 | 5/2002 | Price et al. | |
| 2002/0076157 A1 | 6/2002 | Kropp | |
| 2002/0101898 A1 | 8/2002 | Lo et al. | |
| 2002/0114590 A1 | 8/2002 | Eichenberger et al. | |
| 2002/0136510 A1 | 9/2002 | Heinz et al. | |
| 2002/0149821 A1 | 10/2002 | Aronson et al. | |
| 2002/0159725 A1 | 10/2002 | Bucklen | |
| 2002/0160656 A1 | 10/2002 | Nishita | |
| 2002/0177362 A1 | 11/2002 | Chang | |
| 2002/0186243 A1 | 12/2002 | Ellis et al. | |
| 2003/0016920 A1 | 1/2003 | Sohmura et al. | |
| 2003/0021580 A1 | 1/2003 | Matthews | |
| 2003/0034963 A1 * | 2/2003 | Moon et al. | 345/204 |
| 2003/0117960 A1 | 6/2003 | Quinlan et al. | |
| 2003/0145258 A1 | 7/2003 | Warner et al. | |
| 2003/0198445 A1 | 10/2003 | Inujima et al. | |
| 2003/0208779 A1 * | 11/2003 | Green et al. | 725/143 |
| 2003/0214807 A1 | 11/2003 | Liu | |
| 2003/0223756 A1 | 12/2003 | Tatum et al. | |
| 2004/0008996 A1 | 1/2004 | Aronson et al. | |
| 2004/0076119 A1 | 4/2004 | Aronson et al. | |
| 2004/0141695 A1 | 7/2004 | Miller et al. | |
| 2004/0158873 A1 | 8/2004 | Pasqualino | |
| 2004/0184746 A1 * | 9/2004 | Chang et al. | 385/100 |
| 2004/0208207 A1 | 10/2004 | Kasper et al. | |
| 2004/0208600 A1 | 10/2004 | Guenter et al. | |
| 2004/0252560 A1 | 12/2004 | Hsieh | |
| 2004/0263941 A1 | 12/2004 | Chen et al. | |
| 2004/0264879 A1 | 12/2004 | McColloch et al. | |
| 2005/0036746 A1 | 2/2005 | Scheibenreif et al. | |
| 2005/0036788 A1 | 2/2005 | Matsuoka et al. | |
| 2005/0053340 A1 | 3/2005 | Toriumi et al. | |
| 2005/0063440 A1 * | 3/2005 | Deppe | 372/50 |
| 2005/0063707 A1 * | 3/2005 | Imai | 398/141 |
| 2005/0063711 A1 | 3/2005 | Rossi et al. | |
| 2005/0078916 A1 | 4/2005 | Hosking | |
| 2005/0105910 A1 | 5/2005 | Light | |
| 2005/0105913 A1 | 5/2005 | Ozeki et al. | |
| 2005/0105915 A1 | 5/2005 | Light | |
| 2005/0168957 A1 | 8/2005 | Kawauchi et al. | |
| 2005/0180700 A1 * | 8/2005 | Farr | 385/89 |
| 2005/0232555 A1 | 10/2005 | Rosenberg | |
| 2005/0238358 A1 | 10/2005 | Light | |
| 2005/0249477 A1 | 11/2005 | Parrish | |
| 2005/0286593 A1 | 12/2005 | Guenter | |
| 2005/0286893 A1 | 12/2005 | Horiuchi | |
| 2006/0008276 A1 * | 1/2006 | Sakai et al. | 398/141 |
| 2006/0025018 A1 | 2/2006 | Dube et al. | |
| 2006/0026348 A1 | 2/2006 | Wallace et al. | |
| 2006/0045425 A1 | 3/2006 | Kanie et al. | |
| 2006/0045437 A1 | 3/2006 | Tatum et al. | |
| 2006/0045526 A1 | 3/2006 | Katayama et al. | |
| 2006/0049936 A1 | 3/2006 | Collins et al. | |
| 2006/0067690 A1 * | 3/2006 | Tatum et al. | 398/66 |
| 2006/0077778 A1 * | 4/2006 | Tatum et al. | 369/44.11 |
| 2006/0083518 A1 * | 4/2006 | Lee et al. | 398/155 |
| 2006/0088251 A1 * | 4/2006 | Wang et al. | 385/88 |
| 2006/0093280 A1 | 5/2006 | McColloch et al. | |
| 2006/0142744 A1 | 6/2006 | Boutoussov | |
| 2006/0164115 A1 | 7/2006 | Komiya et al. | |
| 2006/0203830 A1 | 9/2006 | Doi | |
| 2006/0222300 A1 | 10/2006 | Frenzel et al. | |
| 2007/0058976 A1 * | 3/2007 | Tatum et al. | 398/99 |
| 2007/0122086 A1 | 5/2007 | Lin | |
| 2007/0224884 A1 | 9/2007 | Engel et al. | |
| 2007/0233906 A1 * | 10/2007 | Tatum et al. | 710/26 |
| 2007/0291938 A1 | 12/2007 | Rao et al. | |
| 2008/0013896 A1 | 1/2008 | Salzberg et al. | |

FOREIGN PATENT DOCUMENTS

| | | |
|---|---|---|
| JP | 08-008818 | 1/1996 |
| JP | 8130508 | 5/1996 |
| JP | 09-162811 | 6/1997 |
| JP | 2000241642 | 9/2000 |
| JP | 2002208896 | 7/2002 |
| JP | 2002-366340 | 12/2002 |
| JP | 2003-163639 | 6/2003 |
| JP | 2003249711 | 9/2003 |
| JP | 2003-332667 | 11/2003 |
| JP | 2004200847 | 7/2004 |
| JP | 2004213949 | 7/2004 |
| JP | 2004241361 | 8/2004 |
| WO | WO03063309 | 7/2003 |
| WO | 2004054139 | 6/2004 |
| WO | WO2004054139 | 6/2004 |

OTHER PUBLICATIONS

PCT/US2008/059579, Aug. 29, 2008, Int'l Search Report.
PCT/US2007/78658, Mar. 14, 2008, Int'l Search Report.
PCT/US2007/066655, Feb. 8, 2008, Int'l Search Report.
UK 0820337.4, Feb. 2, 2009, Exam Report.
PCT/US2006/036093, Mar. 14, 2008, Int'l Search Report.
CN200780018055.3, Mar. 9, 2010, Office Action.
CN200780018055.3, Sep. 21, 2010, Office Action.
"IEC 825-1 Eye Safety Classification of Some Consumer Electronic products," A.C. Boucouvalas, Bournemouth University, School of Electronics, Talbot campus, Fern Barrow, Pole, Dorset, BH12 5BB, U.K. E-mail: tbournemouth.ac.uk, 1996 The Institution of Electrical Engineers, printed and published by the IEE, Savoy Place, London WC2R OBL, UK, (Web page; 6 pages).
"Fiber Optic Infrastructure," © 2000 by Extreme Networks, Inc.
"Optical DVI-HDCP Extension Cable," by Opticis, dated Aug. 27, 2003.
"Sandia Develops Vertical Cavity Surface Emitting Laser that Promises to Reduce Cost of Fiber Optics Connections," Sandia National Laboratories, Jun. 6, 2000, (Web page; 3 pages). http://www.sandia.gove/media/NewsRel/NR2000/laser.htm.
Caruso, Jeff; "Bandwidth Boom: Making the Connection, Can Fiber Break Through the Glass Ceiling?" Jul. 13, 1998 [retrieved on Apr. 25, 2005]. (Web page; 3 pages). http://www.internetweek.com/supp/bandwidth/canfiber.htm.
Digital Visual Interface DVI Revision I.0, Digital Display Working Group, Apr. 2, 1999.
Full-Scale Entry of Optical Transmission System Business Begins as Fujifilm Introduces Optical Dvi Link System That Utilizes Lumistar, A Graded Index Plastic Optical Fiber-Realizes World's First 30m-Class High-Speed Optical Linking of Digital Images Using a Plastic Optical Fiber; Sep. 8, 2004, (Web Page; 3 pages) http://www.fujifilm.com/news/n040908.html.
High-Definition Multimedia Interface Specification Version 1.1, HDMI Licensing, LLC. May 20, 2004.
High-Definition Multimedia Interface Specification Version 1.2, HDMI Licensing, LLC. Aug. 22, 2005.
Joiner, Steve; Open Fiber Control for Parallel Optics, Communication Semiconductor Solutions Division, Mar. 27, 1997, 13, USA.
Kanellos, Michael; "Intel Connects Chips With Optical Fiber" Feb. 27, 2004 [retrieved on Apr. 26, 2005]. (Web page; 5 pages). http://news.zdnet.com/2100-9574_22-5166883.html.
Kanellos, Michael; "Intel Gets Optical With Fibre" Mar. 1, 2004 [retrieved on Apr. 26, 2005]. (Web page; 2 pages). http://news.zdnet.co.uk/0,39020330,39147918,00.htm.
Opticis, M1-1PO DVI-HDCP Extension Cable, Stretch your Digital Visual Interface Experience, Version 1.03 Aug. 2003, www.opticis.com, 2 pages.
Opticis; "Optical DV1 Extension Module" © 2005 [retrieved on Apr. 25, 2005]. (Web page; 2 pages). http://www.opticis.com/products_2.htm.
U.S. Appl. No. 11/009,208, mailed Oct. 26, 2007, Notice of Allowance.
U.S. Appl. No. 11/009,208, mailed Oct. 1, 2007, Office Action.
U.S. Appl. No. 11/009,208, mailed Apr. 3, 2007, Final Office Action.
U.S. Appl. No. 11/009,208, mailed Jul. 26, 2006, Office Action.
U.S. Appl. No. 11/009,208, mailed Feb. 14, 2006, Office Action.
U.S. Appl. No. 11/468,280, mailed Jan. 12, 2010, Notice of Allowance.
U.S. Appl. No. 11/468,280, mailed Jun. 3, 2009, Office Action.
U.S. Appl. No. 11/468,280, mailed Oct. 20, 2008, Office Action.
U.S. Appl. No. 11/468,280, mailed Jul. 28, 2008, Office Action.
U.S. Appl. No. 11/468,280, mailed Mar. 20, 2008, Final Office Action.
U.S. Appl. No. 11/468,280, mailed Sep. 11, 2007, Office Action.
U.S. Appl. No. 11/402,106, mailed Oct. 20, 2008, Notice of Allowance.
U.S. Appl. No. 11/402,106, mailed Apr. 29, 2008, Office Action.
U.S. Appl. No. 11/402,106, mailed Dec. 28, 2007, Final Office Action.
U.S. Appl. No. 11/402,106, mailed May 7, 2007, Final Office Action.
U.S. Appl. No. 11/402,106, mailed Sep. 21, 2006, Office Action.
U.S. Appl. No. 11/402,186, mailed Apr. 5, 2010, Notice of Allowance.
U.S. Appl. No. 11/402,186, mailed Aug. 13, 2009, Office Action.
U.S. Appl. No. 11/402,186, mailed Jul. 3, 2007, Final Office Action.
U.S. Appl. No. 11/402,186, mailed Oct. 10, 2006, Office Action.
U.S. Appl. No. 11/198,606, mailed Dec. 7, 2009, Notice of Allowance.
U.S. Appl. No. 11/198,606, mailed Nov. 23, 2009, Office Action.
U.S. Appl. No. 11/198,606, mailed Feb. 24, 2009, Office Action.
U.S. Appl. No. 11/198,606, mailed Jul. 9, 2008, Final Office Action.
U.S. Appl. No. 11/198,606, mailed Dec. 31, 2007, Office Action.
U.S. Appl. No. 11/470,623, mailed Apr. 26, 2010, Notice of Allowance.
U.S. Appl. No. 11/470,623, mailed Jan. 11, 2010, Notice of Allowance.
U.S. Appl. No. 11/470,623, mailed Apr. 17, 2009, Office Action.
U.S. Appl. No. 11/470,623, mailed Sep. 9, 2008, Final Office Action.
U.S. Appl. No. 11/470,623, mailed Feb. 19, 2008, Office Action.
U.S. Appl. No. 11/470,623, mailed Aug. 19, 2010, Notice of Allowance.
U.S. Appl. No. 11/401,803, mailed Jun. 30, 2008, Notice of Allowance.
U.S. Appl. No. 11/401,803, mailed Apr. 3, 2008, Notice of Allowance.
U.S. Appl. No. 11/401,803, mailed Aug. 24, 2007, Office Action.
U.S. Appl. No. 11/401,803, mailed Jul. 11, 2007, Office Action.
U.S. Appl. No. 11/401,802, mailed May 20, 2010, Notice of Allowance.
U.S. Appl. No. 11/401,802, mailed Nov. 30, 2009, Office Action.
U.S. Appl. No. 11/401,802, mailed Feb. 3, 2009, Office Action.
U.S. Appl. No. 11/401,802, mailed Jul. 30, 2008, Panel Decision.
U.S. Appl. No. 11/401,802, mailed Mar. 20, 2008, Final Office Action.
U.S. Appl. No. 11/401,802, mailed Nov. 1, 2007, Restriction Requirement.
U.S. Appl. No. 11/401,802, mailed Apr. 17, 2007, Office Action.
U.S. Appl. No. 11/402,241, mailed Dec. 29, 2009, Office Action.
U.S. Appl. No. 11/402,241, mailed Mar. 25, 2008, Office Action.
U.S. Appl. No. 11/402,241, mailed Apr. 17, 2007, Office Action.
U.S. Appl. No. 11/402,241, mailed Nov. 1, 2007, Restriction Requirement.
U.S. Appl. No. 11/402,241, mailed May 29, 2009, Final Office Action.
U.S. Appl. No. 11/402,241, mailed Jul. 9, 2010, Final Office Action.
U.S. Appl. No. 11/402,169, mailed Apr. 1, 2010, Notice of Allowance.
U.S. Appl. No. 11/402,169, mailed Feb. 16, 2010, Notice of Allowance.
U.S. Appl. No. 11/402,169, mailed Dec. 23, 2009, Notice of Allowance.
U.S. Appl. No. 11/402,169, mailed Feb. 10, 2009, Office Action.
U.S. Appl. No. 11/402,169, mailed Feb. 21, 2008, Final Office Action.
U.S. Appl. No. 11/402,169, mailed Jun. 29, 2007, Office Action.
U.S. Appl. No. 11/402,161, mailed Mar. 14, 2008, Notice of Allowance.
U.S. Appl. No. 11/402,161, mailed Sep. 11, 2007, Office Action.
U.S. Appl. No. 11/402,161, mailed May 31, 2007, Office Action.
U.S. Appl. No. 11/198,619, mailed Apr. 13, 2009, Notice of Allowance.
U.S. Appl. No. 11/198,619, mailed Dec. 17, 2008, Office Action.
U.S. Appl. No. 11/198,619, mailed Apr. 18, 2008, Office Action.
U.S. Appl. No. 11/198,619, mailed Nov. 16, 2007, Office Action.
U.S. Appl. No. 11/198,619, mailed May 4, 2007, Office Action.
U.S. Appl. No. 11/198,619, mailed Oct. 11, 2006, Office Action.
U.S. Appl. No. 12/262,872, mailed Nov. 30, 2009, Office Action.
U.S. Appl. No. 12/262,872, mailed Aug. 13, 2009, Restriction Requirement.
U.S. Appl. No. 12/262,872, mailed Aug. 24, 2009, Interview Summary.
U.S. Appl. No. 12/262,872, mailed Mar. 29, 2010, Notice of Allowance.
U.S. Appl. No. 12/098,343, mailed Nov. 8, 2010, Office Action.
U.S. Appl. No. 12/098,343, mailed Feb. 10, 2011, Final Office Action.
U.S. Appl. No. 11/402,241, mailed Dec. 17, 2010, Office Action.

* cited by examiner

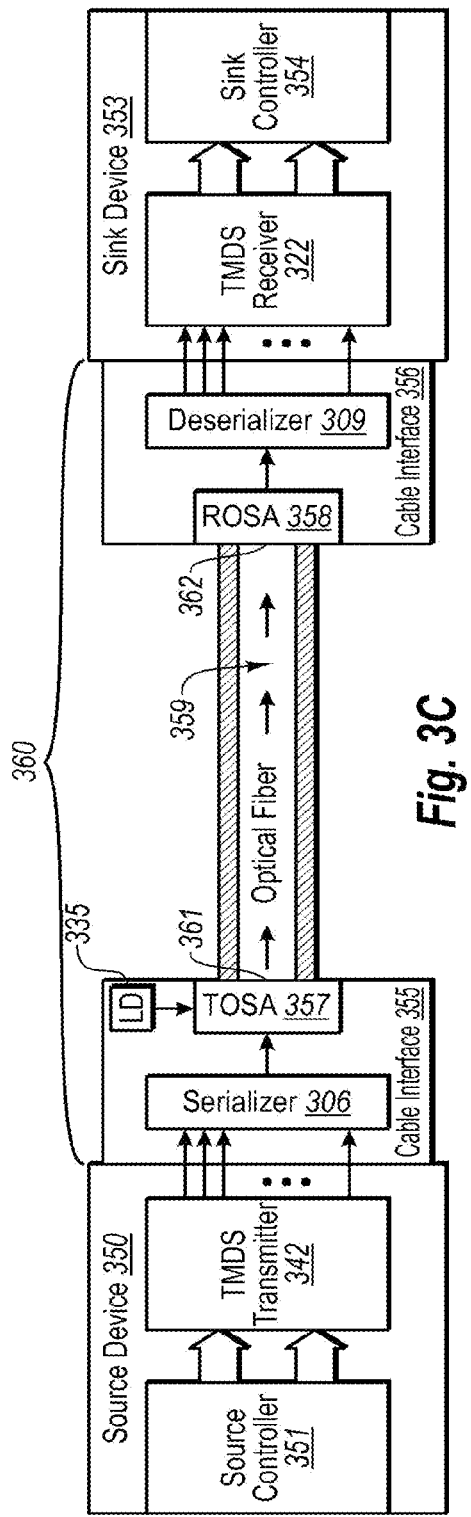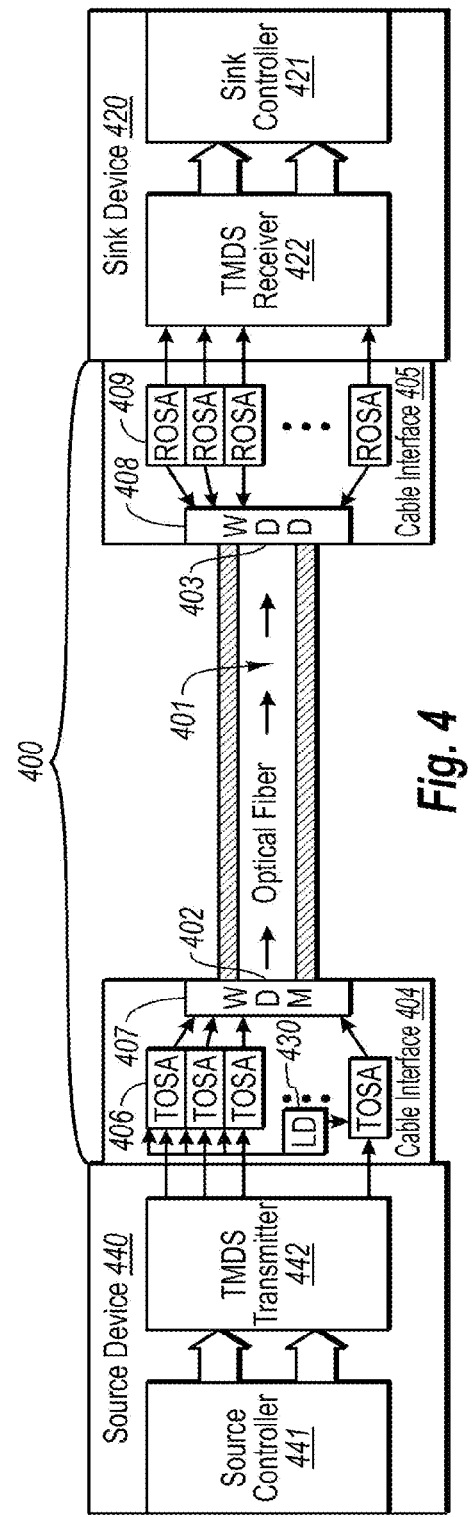

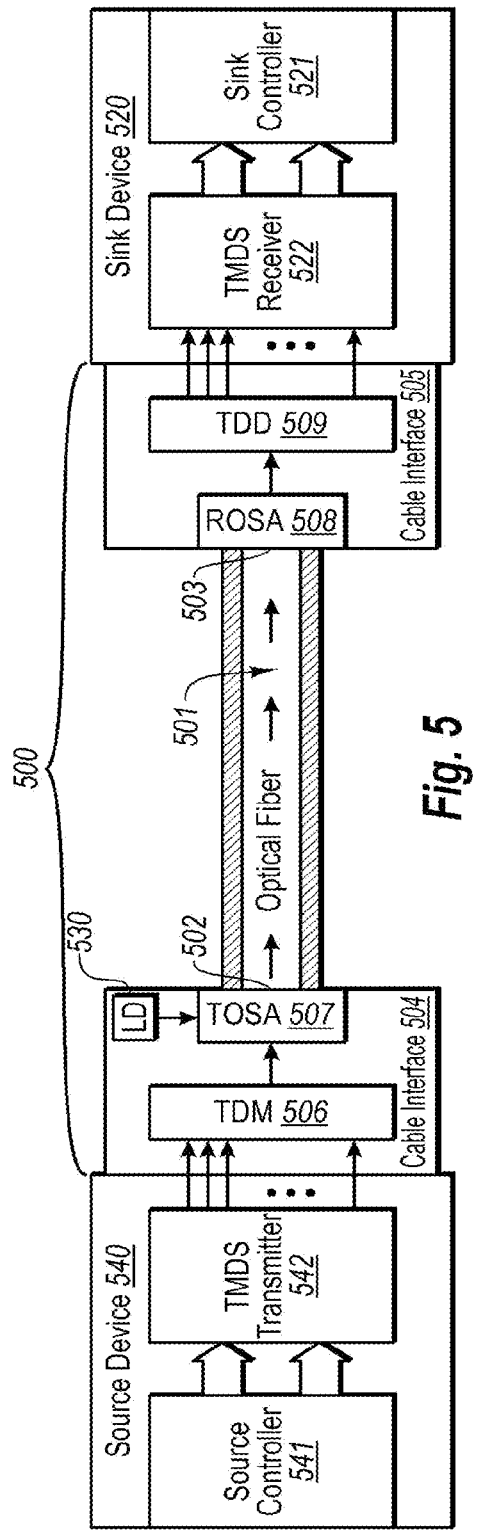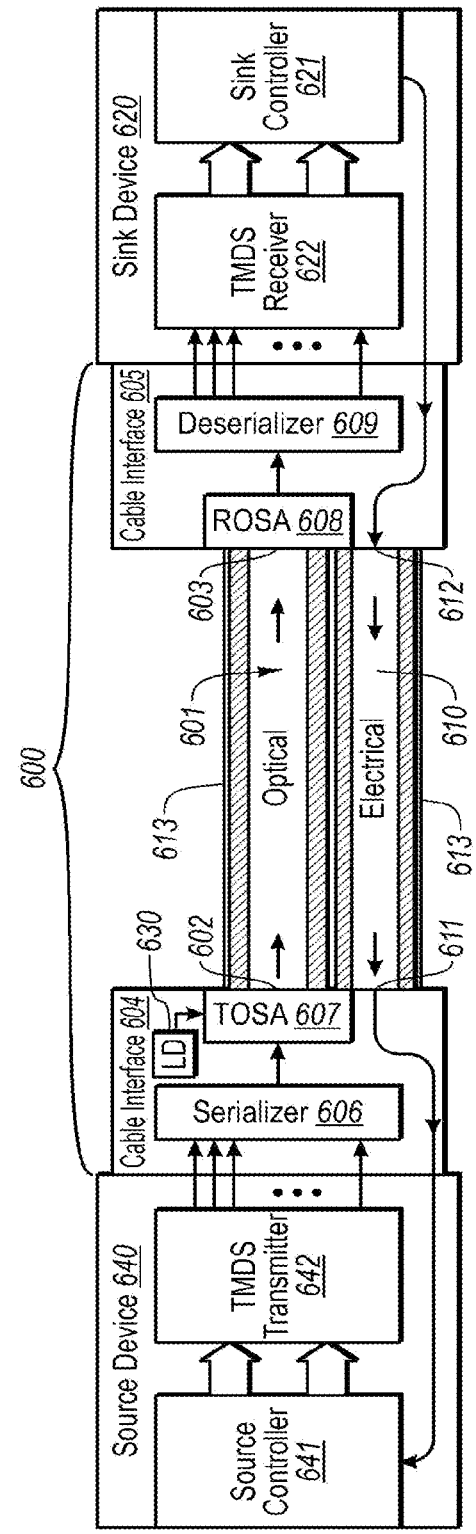

LASER DRIVERS FOR CLOSED PATH OPTICAL CABLES

CROSS-REFERENCE TO RELATED APPLICATIONS

This application is a continuation of U.S. application Ser. No. 11/470,623 filed Sep. 6, 2006, which claims the benefit of U.S. Provisional Patent Application No. 60/717,352 filed Sep. 15, 2005, the contents of each of which are hereby incorporated herein by reference. This application is related to U.S. patent application Ser. No. 11/198,619 filed on Aug. 5, 2005, entitled "Optical Cables for Consumer Electronics", which claims the benefit of U.S. Provisional Application No. 60/614,199 filed on Sep. 29, 2004 entitled "Optical DVI Cables", the contents of both applications are hereby incorporated herein by reference. This application is related to U.S. patent application Ser. No. 10/316,355 entitled "OPTICAL TRANSCEIVER" filed Dec. 11, 2002, which is a CIP of U.S. patent application Ser. No. 10/163,057, filed Jun. 4, 2002, entitled "OPTICAL TRANSCEIVER", the contents of both applications are incorporated by reference herein. This application is related to U.S. patent application Ser. No. 10/308,308, entitled "BIDIRECTIONAL OPTICAL DEVICE" filed Dec. 3, 2002, the contents of which are incorporated by reference herein. This application is related to U.S. patent application Ser. No. 10/877,915 entitled "LIGHT EMITTING DEVICE WITH AN INTEGRATED MONITOR PHOTODIODE" filed Jun. 25, 2004, the contents of which are incorporated by reference herein. This application is related to U.S. patent application Ser. No. 11/082,521 entitled "LASER PACKAGE WITH DIGITAL ELECTRONIC INTERFACE" filed Mar. 17, 2005, which claims the benefit of U.S. Provisional Application Ser. No. 60/605,781, entitled "LASER WITH DIGITAL ELECTRONIC INTERFACE" filed Aug. 31, 2004, the contents of which are incorporated by reference herein. This application is related to U.S. patent application Ser. No. 10/163,440, entitled "METHOD AND APPARATUS FOR MONITORING THE POWER OF A MULTI-WAVELENGTH OPTICAL SIGNAL" filed Aug. 10, 2004, the contents which are incorporated by reference herein.

BACKGROUND OF THE INVENTION

1. The Field of the Invention

The present invention relates to communication cables. More specifically, the present invention relates to laser drivers for powering lasers within closed path digital optical cables.

2. The Relevant Technology

Electro-Optical Communication Technology

Networks employing fiber optic technology are known as optical communications networks. To communicate over a network using fiber optic technology, fiber optic components such as fiber optic transceivers are used to send and receive optical data. Generally, a fiber optic transceiver can include one or more optical subassemblies (OSA) such as a transmitter optical subassembly (TOSA) for sending optical signals, and a receiver optical subassembly (ROSA) for receiving optical signals. In particular, a typical TOSA includes an optical transmitter, such as a laser, for sending an optical signal. Many different types of lasers are known to those skilled in the art. One type of laser referred to as a vertical cavity surface emitting laser (VCSEL) emits light in a single direction through an upper surface of the laser structure.

Conventionally, output characteristics of a TOSA must be controlled by complex circuitry and/or programming. Conventional laser drivers typically include control and setup circuitry to control and drive the laser over the intended application temperature range. In addition, a variety of industry performance and safety optical standards often apply that must be adhered to. As a result, conventional laser drivers generally include some form of closed path power control circuit, temperature programming of the laser bias current, etc.

Conventional TOSAs also may include a monitor, such as a photodiode, that generates feedback concerning performance characteristics of the laser. The monitoring function may be necessary in order to maintain required modulation rates and on/off extinction ratios. Average power techniques may be used to control the power output of the laser. For example, an automatic power-control (APC) feedback loop may be incorporated to maintain a constant average optical output power from the laser over temperature and lifetime. The laser driver circuitry is also often designed to compensate for signal degradation and parasitics using methods such as peaking on electrical signals or use of passive electrical matching networks. Control over laser output characteristics becomes of increased importance as rates of data transmission increase.

Optical networks must also meet various industry standards. For example, there are Fibre Channel and Ethernet industry standards. The International Electrotechnical Commission (IEC), for example, sets forth standards for hazardous light emissions from fiber optic transceivers. One standard, IEC 825, defines the maximum light output for various hazard levels. Thus, conventional laser drivers include circuitry and/or components, such as a monitor, in order to adhere to such industry standards.

Several safety precautions are incorporated into current transceiver designs to satisfy the various safety standards. For example, a common safety precaution is single-point fault tolerance, whereby one unplanned short, open, or resistive connection does not cause excess light output. Even with the various safety precautions included by manufacturers to prevent violations (typically constituting monitoring circuitry and control components), manufacturers and consumers must still be aware of various levels of fault tolerance required by the particular application and ensure that the components are compliant.

Controlling output parameters and meeting industry standards can be particularly difficult for optical transmission devices that use VCSELs as their optical source. Laser drivers for high-speed VCSEL applications typically contain a bias generator, a laser modulator, and comprehensive safety features. Circuitry and electronic components are typically used for automatic power control (APC), which adjusts the laser bias current to maintain average optical power over changes in temperature and laser properties. The laser driver can accommodate common cathode and differential configurations. Adjustable temperature compensation is typically provided to keep the optical extinction ratio of the VCSEL within specifications over the VCSEL's operating temperature range. The laser drivers for VCSELs can also include circuits for detecting safety faults that can cause hazardous light levels or violate other multisource agreements.

A modulator can further include circuitry for peaking compensation. Other circuitry can prevent current spikes to the laser during power-up or enable, further ensuring compliance with various safety standards. The modulation circuitry can include an input buffer, a current mirror, and a high-speed current switch. The modulation circuitry is typically also controlled based on the temperature of the laser and according to other external program codes to insure that the laser meets the various safety standards.

As a result of the foregoing, laser drivers for conventional optical laser signal transmission devices have required a significant number of passive components and/or programming for their use. These additional components add cost and complexity to the devices. For example, conventional laser drivers, such as the MAX3740A made by Maxim Integrated Products, require several thousands of transistors (e.g. 3806 transistors for the MAX3740A implementation).

Introduction to Digital Consumer Electronics

Digital consumer electronics, such as digital video displays, digital video disk (DVD) readers, flat screen computer monitors, high definition television (HDTV), digital plasma screens, digital audio readers, digital audio encoders, digital audio amplifiers, and digital audio processing devices have become of increased popularity. As the amount of data transferred between digital components expands to accommodate the desire for greater resolution, size, and quality, the need for high speed data transfer of digital data also increases. Several standards supporting data transfer to digital consumer electronic devices have been developed, but many have not adequately addressed the high bandwidth and high resolution needs of emerging products. For example, two current standards implemented for transmission of digital video and/or digital audio include the digital video interface (DVI) standard and high definition multimedia interface (HDMI) standard. Both the HDMI standard and the DVI standards are based on transmission minimized differential signaling (TMDS), Silicon Image's high-speed, serial link technology.

1. DVI Technology

DVI is a display interface developed by the Digital Display Working Group (DDWG). The DVI specification can provide a high-speed digital connection between DVI digital source devices (i.e. compliant DVI digital video processing devices) and DVI digital sink devices (i.e. compliant DVI digital video display devices). One common implementation of DVI is an interface for a computer having a video controller card and a digital display device (e.g. CRT, LCD, projector, etc.) having a display controller.

The DVI interface standard and description are contained within the publication entitled *Digital Visual Interface*, Revision 1.0, published by the Digital Display Working Group on Apr. 2, 1999, the contents of which are hereby expressly incorporated herein by reference. DVI utilizes a high-speed serial interface and TMDS to send data to the DVI sink device. TMDS conveys data by transitioning between "on" and "off" states. An encoding algorithm uses Boolean exclusive OR (XOR) or exclusive NOR (XNOR) operations applied to minimize the transitions to avoid excessive electromagnetic interference (EMI) levels in the DVI cable. An additional operation is performed to balance the DC signal.

The DVI connector has 24 pins that can accommodate up to two TMDS links. The basic TMDS transmission line is made up of three data channels and a clock channel. Data comprise 8-bit pixels in each of three channels (R/G/B). In some instances, a pair of conventional TMDS lines may be used to achieve higher data rates. In addition to the TMDS data channels and clock channels, the DVI includes a 5V DC power source, and a hot plug detect channel. The DVI-I combined digital and analog pin assignments are similar to the DVI-D digital only interface pin assignments, but further includes several pins for transmission of an analog signal.

FIG. 1 illustrates the typical flow of data from a graphics controller 120 of a DVI source device 125, such as a digital video processing device, through the TMDS links 130 and to the display controller 135 of a DVI sink device 140, such as a digital video display device. In this process, incoming 8-bit data are encoded into 10-bit transition-minimized, DC-balanced characters. The first eight bits are encoded data, and the ninth bit identifies whether the data was encoded with XOR or XNOR logic; the tenth bit is used for DC balancing.

Due to the defined properties of the DVI interface, DVI cables having copper electrical cables may be limited to a length of about 3-5 meters. This limited length reduces the number of potential applications that can utilize DVI cables. For example, the length limits remote placement of digital video components.

Typical DVI cables having copper electrical links are also limited in bandwidth and data transfer rates. DVI data rates typically range from 22.5 mega pixels per second (Mpps) to 165 Mpps (up to 1.65 Giga bits per second). Because TMDS conveys data by transitioning between "on" and "off" states, EMI levels in the DVI cable can also limit the speed at which data may be transferred.

Further, although DVI is a standard interface, some digital video processors and digital video displays may be incompatible or incapable of interoperation with one another. Thus, at least in some environments, bidirectional communication for reconfiguring a digital video processor and/or digital video display would be desirable. Unfortunately, configuration data are typically not transmitted. Further, many DVI interfaces lack sufficient connectivity to transmit data (e.g. configuration data) from the digital video display to the digital video processor. As a result, a digital video processor and a digital video display may remain incompatible.

2. HDMI Technology

HDMI is backward compatible with devices incorporating the DVI standard. HDMI is based on the TMDS serial link technology. HDMI technology supports standard, enhanced, or high-definition video, plus multi-channel digital audio on a single cable. It transmits Advanced Television Systems Committee's (ATSC's) HDTV standards and supports 8-channel digital audio with 5 Giga bits per second of bandwidth. The HDMI technology, functionality, and hardware is disclosed in the "High-Definition Multimedia Interface" specification Version 1.1, May 20, 2004, by HDMI Licensing, LLC, the contents of which are hereby expressly incorporated by reference herein in their entirety.

The HDMI interface is provided for transmitting digital television audiovisual signals from DVD players, set-top boxes, and other audiovisual consumer electronic source devices to HDMI consumer electronic sink devices, such as television sets, projectors, and other audio visual devices. HDMI can carry multi-channel audio data and can carry standard and high definition consumer electronics video formats. Content protection technology is also available. HDMI can also carry control and status information in both directions.

Referring to FIG. 2, an HDMI block diagram is shown where a standard HDMI cable includes four differential pairs 201-204 that make up the TMDS data and clock channels, referred to collectively as HDMI TMDS links 200. These links 200 are used to carry video, audio and auxiliary data. In addition, HDMI carries a VESA Display Data Channel (DDC) 205. The DDC 205 is used for configuration and status exchange between an HDMI source 210 and an HDMI sink 215. The optional CEC protocol line 220 provides high-level control functions between all of the various audiovisual products in a user's environment.

Audio, video and auxiliary data are transmitted across the three TMDS data channels 201-203. Video pixel clock data are transmitted on the TMDS clock channel 204 and are used by an HDMI receiver 230 as a frequency reference for data recovery on the three TMDS data channels 201-203. Video data are carried as a series of 24-bit pixels on the three TMDS data channels 201-203. TMDS encoding converts the 8 bits per channel into a 10-bit DC-balanced, transition minimized sequence, which is then transmitted serially across the HDMI TMDS data channels 201-203 at a rate of 10 bits per pixel clock period. Video pixel rates can range from 25 MHz to 165 MHz. The video pixels can be encoded in either RGB, YCBCR 4:4:4 or YCBCR 4:2:2 formats.

In order to transmit audio and auxiliary data across the links 200, HDMI uses a packet structure. In order to attain higher reliability of audio and control data, these data are protected with an error correction code and are encoded using a special error reduction coding to produce the 10-bit word that is transmitted. Optionally, HDMI can carry one such stream at sample rates up to 192 kHz or from two to four such streams (3 to 8 audio channels) at sample rates up to 96 kHz. HDMI can also carry compressed (e.g. surround-sound) streams. The DDC channel 205 is used by the HDMI source device 210 to read the HDMI sink device's 215 Enhanced Extended Display Identification Data (E-EDID) to discover the sink device's 215 configuration and/or capabilities. The HDMI source device 210 reads the sink device's 215 E-EDID and delivers only the audio and video formats that are supported by the sink device 215. In addition, the HDMI sink device 215 can detect Info Frames and process the received audio and video data appropriately.

A digital consumer device's external HDMI connection is embodied by two specified HDMI connectors, Type A or Type B. These connectors can be attached directly to the device or can be attached via a cable adapter that is shipped with the device. The Type A connector carries all required HDMI signals, including a single TMDS link. The Type B connector is slightly larger and carries a second TMDS link, which is necessary to support very high-resolution computer displays requiring dual link bandwidth.

The CEC protocol line 220 is optionally used for higher-level user functions such as automatic setup tasks or tasks typically associated with infrared remote control usage. The Type A connector carries only a single TMDS link and is therefore only permitted to carry signals up to 165 Mpps. To support signals greater than 165 Mpps, the dual-link capability of the Type B connector is used.

The input stream to the HDMI source's transmitter 235 from the HDMI source's controller 240 will contain video pixel, packet, and control data. The packet data can include audio data, auxiliary data, and associated error correction codes. These data items are processed in a variety of ways and are presented to the HDMI source's transmitter 235 as either 2 bits of control data, 4 bits of packet data or 8 bits of video data per TMDS channel. The HDMI source controller 240 encodes one of these data types or encodes a Guard Band character on any given clock cycle. The stream of TMDS characters produced by the transmitter 235 is serialized for transmission on the TMDS data channels 201-203.

These current cables and solutions, as well as others, are limited in many ways in their capabilities to carry digital video and/or audio signals. For example, these digital video and/or audio cables are limited in bandwidth and distance in which they can carry TMDS signals. One solution to the problem of limited length of these cables is a repeater, which is a device with a retransmission function for extension or distribution of digital video and/or audio signals from cables such as DVI and HDMI cables. The circuitry of a repeater can retrieve, equalize, amplify, and re-transmit the digital video and/or digital audio signals into another length of cable. A repeater may be capable of transmitting digital video and/or audio signals to about 25 or 35 meters in some instances. However, a repeater can be quite expensive, add additional hardware and circuitry, require additional cables for the extension, and even still be relatively limited in distances to which the repeater can transmit digital video and/or audio signals and bandwidth of the cables. Therefore, repeaters have not provided a desired solution to many of the problems currently experienced with these cables, but rather have tried to mitigate the limitations of such cables.

Thus, for these reasons, as well as others, what would be advantageous are simplified and cost effective laser drivers for optical cables.

SUMMARY

A digital optical cable for coupling a digital source device with a digital sink device is disclosed. The digital optical cable includes an optical fiber having a first end and a second end. The digital optical cable further includes a first interface configured to couple the digital source device to the first end of the optical fiber. The first interface includes an optical transmitter for receiving an electronic signal from the digital source device, converting the electronic signal to an optical signal, and transmitting the optical signal onto the first end of the optical fiber. The digital optical cable further includes a laser driver for providing a drive current to the optical transmitter. The laser driver includes a modulation current source with a single modulation point and a single temperature coefficient. The digital optical cable further includes a second interface configured to couple the digital sink device to the second end of the optical fiber. The second interface comprising an optical receiver for receiving the optical signal transmitted by the optical transmitter from the second end of the optical fiber, converting the optical signal to an electronic signal, and transmitting the electronic signal to the digital sink device.

A cable for bidirectional communication between a first digital consumer electronic device and a second digital consumer electronic device is disclosed. The cable includes an optical fiber having a first end and a second end. The cable further includes a first interface coupled to the first end of the optical fiber. The first interface includes first electrical connections configured to receive electrical TMDS signals from a receptacle of the first digital consumer electronic device. The first interface further includes means for converting at least one of the TMDS signals to an outgoing optical signal and for transmitting the outgoing optical signal onto the first end of the optical fiber. The first interface further includes a laser driver for driving the means for converting at least one of the TMDS signals to an outgoing optical signal and for transmitting the outgoing optical signal onto the first end of the optical fiber. The cable further includes a second interface. The second interface includes an optical receiver for receiving the outgoing optical signal and for converting the outgoing optical signal back into the at least one of the TMDS signals. The second interface further includes second electrical connections configured to transmit the electrical TMDS signals to a receptacle of the second digital electronic consumer device.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3C illustrates a digital optical cable according to an example embodiment of the present invention;

FIG. 4 illustrates a digital optical cable according to an example embodiment of the present invention;

FIG. 5 illustrates a digital optical cable according to an example embodiment of the present invention;

FIG. 6 illustrates a digital optical cable according to an example embodiment of the present invention;

DETAILED DESCRIPTION OF THE PREFERRED EMBODIMENTS

Figure 1:
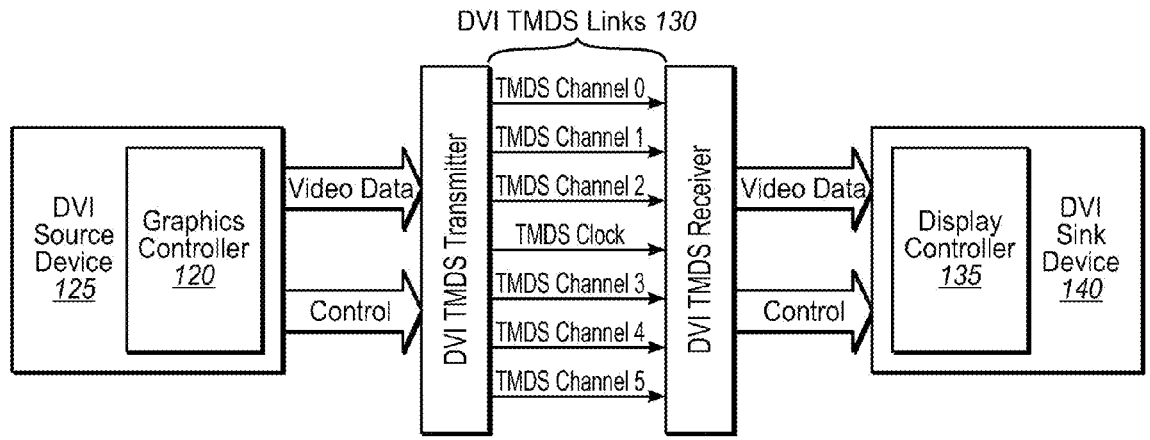
FIG. 1 illustrates the typical flow of data from the graphics controller of a DVI source to the display controller of a DVI sink device.

The principles of the present invention are described with reference to the attached drawings, which illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention.

Digital optical cables discussed herein can include a laser (e.g. a VCSEL) for transmitting an optical signal over an optical fiber. The digital optical cables can be closed path in that all of the optical components are contained within the optical cables. As a result, the laser of the digital optical cables discussed below may not need to conform to at least some of the industry standards or other operating constraints required in the past. Thus, one aspect of several embodiments relates to a simplified laser driver for supplying a drive current to the lasers.

The laser drivers implemented in the digital optical cables described herein can include less components than a conventional laser driver. For example, the laser drivers can include less transistors than a conventional laser driver. According to an example embodiment, a laser driver can include less than 100 transistors, for example about five or less transistors.

Because the laser drivers can have less components, these laser drivers can be much simpler than the conventional laser drivers discussed above. The laser drivers can also include less programming and control. For example, the laser drivers implemented in the digital optical cables can include a bias current with a single control value for all lasers and temperatures. Because the laser drivers have a single control value for all lasers and temperatures, feedback regarding power output from the bias current source may not be required. As a result, a monitor photodiode and circuitry for average power control may not be required, therefore further simplifying control of the bias current supplied to the laser. In addition, temperature compensation of the bias current source can be eliminated and a single bias current control can be used for all temperatures of the laser.

The laser drivers can include a modulation current source for providing a modulated current to the laser. The modulation current source can have a single control value for all lasers and a single temperature coefficient for all lasers. This can eliminate temperature compensation of the modulation and/or external program controls required by conventional TOSAs.

In several applications, there is a limited temperature range of operation for the digital optical cables, and link budget analysis allows for a very low optical extinction ratio. There can therefore be a single constant current bias point. A temperature compensated modulation current may also suffice. Thus, several embodiments relate to laser drivers with significant reduction in circuit requirements, particularly in regards to temperature compensation and power control. This can significantly reduce the cost and complexity of the laser driver output stage.

Figure 3A:
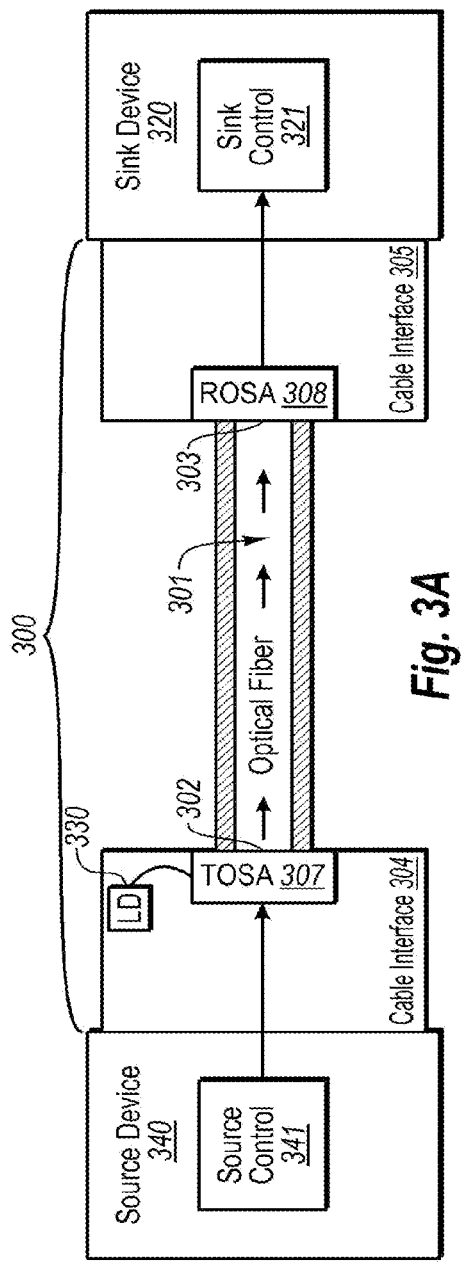
FIG. 3A illustrates a digital optical cable according to an example embodiment of the present invention.

Referring to FIG. 3A, a closed path digital optical cable 300 is illustrated according to an example embodiment. The digital optical cable 300 can include an input cable interface 304 and an output cable interface 305. The input cable interface 304 can be electrically coupled to a source device 340. The source device 340 can include a source controller 341. The source controller 341 can transmit at least one electrical signal to a TOSA 307 within the input cable interface 304 of the closed path digital optical cable 300. The TOSA 307 receives the at least one electronic signal from the source controller 341, converts the at least one electronic signal into at least one optical signal, and transmits the at least one optical signal to a first end 302 of an optical fiber 301. The at least one optical signal is received from a second end 303 of the optical fiber 301 by a ROSA 308 within the output cable interface 305. The ROSA 308 converts the at least one optical signal into at least one electrical signal and transmits the at least one electrical signal to a sink controller 321 within a sink device 320.

A laser driver 330 is electrically coupled to the TOSA 307 and provides a drive current to a laser diode within the TOSA 307. The laser driver 330 can include less circuitry, components, control, and/or programming than a conventional laser driver because the optical path from the TOSA 307 to the ROSA 308 is closed. The laser driver 330 can be located inside or outside of the TOSA 307.

Figure 3B:
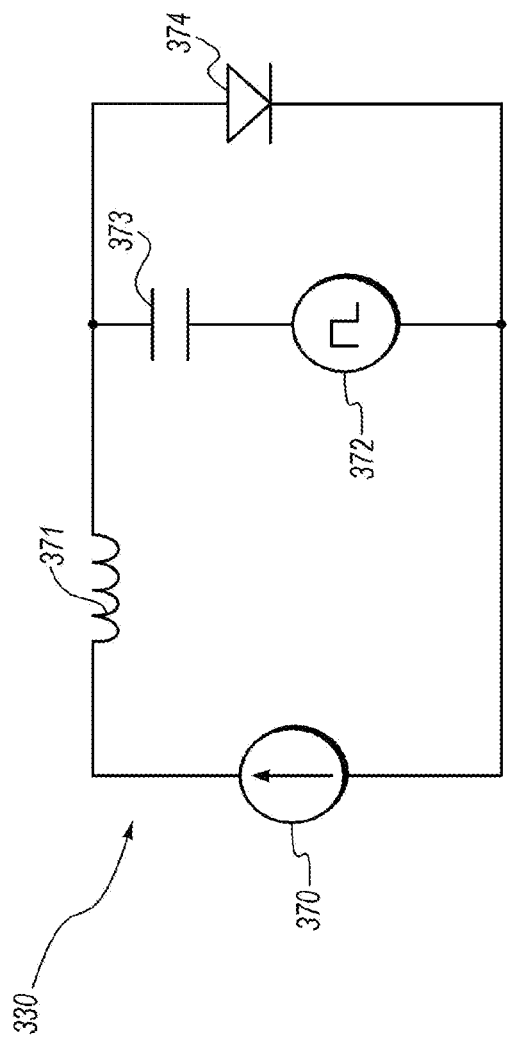
FIG. 3B illustrates a simplified driver circuit for driving a laser within a closed path digital optical cable according to an example embodiment of the present invention.

Referring to FIG. 3B, a simplified laser driver circuit 330 is shown according to an example embodiment of the present invention. The laser driver circuit 330 can include a bias source 370, an inductor 371, a modulation source 372, and a capacitor 373 for driving a laser diode 374. The bias source 370 can have a single constant current bias point for the laser diode 374. The modulation current source 372 can have a single temperature coefficient for the laser diode 374. The laser driver 330 can exclude, for example, temperature compensation, external programming, power control based on output of the laser diode, a monitor diode, and/or control based on feedback received from a component or sensor within the TOSA. Thus, the laser driver circuit 330 illustrated in FIG. 3B can be much simpler than conventional laser drivers.

Referring to FIG. 3C, a digital optical cable 360 is shown according to an example embodiment of the present invention. The digital optical cable 360 can comprise an optical fiber 359 having a first end 361 and a second end 362. A first interface 355 is coupled to the first end 361 of the optical fiber 359, and a second interface 356 is coupled to the second end 362 of the optical fiber 359.

As shown in FIG. 3C, the first interface 355 of the digital optical cable 360 is coupled to a digital source device 350, such as a DVI or HDMI digital video and/or audio processing device. The digital source device 350 includes a source controller 351 and a TMDS transmitter 342. The second interface 356 of the digital optical cable 360 is coupled to a digital sink device 353, such as a DVI or HDMI digital video display and/or audio output device. The digital sink device 353 includes a TMDS receiver 322 and a sink controller 354.

The first interface 355 of the digital optical cable 360 can include a serializer 306, such as an electronic serializer circuit, and a means for converting an electrical signal to an optical signal, such as a TOSA 357. The serializer 306 may be an electrical serializer circuit that receives the electrical TMDS signals (the number of TMDS signals depends on the standard) from the TMDS transmitter 342 and serializes the TMDS signals into a single electrical signal. The TOSA 357 can include an optical transmitter, such as a light emitting diode (LED) or a laser diode (e.g. a VCSEL) that receives the electrical serialized data signal from the serializer 306 and converts the electrical serialized data signal into an optical serialized data signal for transmission onto the optical fiber 359.

The TOSA 357 can receive a drive current from a laser driver 335. The laser driver 335 can be the simplified laser driver 330 illustrated in FIG. 3B. The laser driver 335 can include a bias source and a modulation source. The bias source can have a single constant current bias point for all laser diodes. The modulation current source can have a single temperature coefficient for all laser diodes. The laser driver 335 can exclude, for example, any one of temperature compensation of the modulation or bias current sources, external programming of the modulation or bias current sources, power control based on output of the laser diode, and/or control based on feedback received from a monitor within the TOSA.

The second interface 356 of the digital optical cable 300 includes a means for receiving the optical signal and converting the optical signal to an electrical signal, such as receive optical subassembly (ROSA) 358. The ROSA 358 can include an optical receiver, such as a photodiode, that receives the optical serialized data signal from the optical fiber 359 and converts the optical serialized data signal to an electrical serialized data signal. A deserializer 309 may be an electrical deserializer circuit that receives the electrical serialized data signal from the ROSA 358 and deserializes the electrical serialized data signal into TMDS signals (the number of TMDS signals will depend on the standard) for transmission to the TMDS receiver 322 of the digital sink device 353.

In operation, the digital source device 350 (i.e. a consumer electronic device such as a DVD player, digital cable box, or computer) is connected to the first interface 355 of the digital optical cable 360. The second interface 356 of the digital optical cable 360 is connected to the sink device 355 (i.e. a consumer electronic device such as a digital television, digital audio system, or a digital monitor).

To display a digital video image and/or play digital audio on the digital sink device 353, the source controller 351 of the digital source device 350 transmits data signals, such as pixel data, audio data, and/or control data, to the TMDS transmitter 342, which converts the data signals into the TMDS data signal format for a particular standard (e.g. DVI or HDMI). The TMDS transmitter 342 transmits the TMDS data signals to the serializer 306. The serializer 306 receives the TMDS signals and serializes the TMDS signals into a single electrical serialized data signal. The serializer 306 transmits the electrical serialized data signal to the TOSA 357. The TOSA 357 converts the electrical serialized data signal to an optical serialized data signal and transmits the optical serialized data signal to the optical fiber 359.

The optical serialized data signal is received by the ROSA 358 of the second interface 356 from the optical fiber 359 and the ROSA 358 converts the optical serialized data signal back to an electrical serialized data signal. The ROSA 358 transmits the electrical serialized data signal to a deserializer 309, which deserializes the electrical serialized data signal back into several TMDS signals depending on the standard used by the digital sink device 353 (e.g. the DVI or HDMI standard). The deserializer 309 transmits the TMDS signals to a TMDS receiver 322 located on the digital sink device 353. The TMDS receiver 322 converts the TMDS signals to video and/or audio data signals, such as pixel data, audio data, and/or control data, and the signals are output to the sink controller 354 of the digital sink device 353.

Referring now to FIG. 4, a digital optical cable 400 is shown according to another example embodiment of the present invention. According to the embodiment shown in FIG. 4, a first interface 404 can include a plurality of TOSAs (or transmit chips) 406 and a wavelength-division multiplexer (WDM) 407. Wavelength-division multiplexing combines beams of light from different wavelengths into a single optical transmission to be received by an optical fiber. A second interface 405 includes a wavelength-division demultiplexer (WDD) 408 and a plurality of ROSAs (or receiver chips) 409. The WDD 408 separates a multiplexed beam into separate beams of light of different wavelengths In operation, the digital source device 440 is connected to the first interface 404 of the digital optical cable 400. The second interface 405 of the digital optical cable 400 is connected to the digital sink device 420. The source controller 441 of the source device 440 produces data signals, such as pixel data, audio data, and/or control data. The data signals are transmitted to the TMDS transmitter 442, which converts the data signals into the TMDS data signal format (conforming to the applicable standard, e.g. DVI or HDMI). The TMDS transmitter 442 transmits the TMDS data signals to the plurality of TOSAs 406, one TOSA receiving each TMDS data signal. The TOSAs 406 each include an optical transmitter, such as a laser or LED. Each TOSA 406 transmits light at a slightly shifted wavelength from the other TOSAs 406. The TOSAs 406 convert the electrical TMDS signals to optical signals and transmit the optical signals to the WDM 407. The WDM 407 receives the optical signals and combines the optical signals from the different transmitters (each at a different wavelength) into a multiplexed optical signal, and transmits the multiplexed optical signal onto a first end 402 of the optical fiber 401.

The TOSAs 406 can receive a drive current from a laser driver 430 (or several laser drivers). The laser driver 430 can be the simplified laser driver illustrated in FIG. 3B. The laser driver 430 can include a bias source and a modulation source. The bias source can have a single constant current bias point for all laser diodes. The modulation current source can have a single temperature coefficient for all laser diodes. The laser driver can exclude, for example, any one of temperature compensation of the modulation or bias current sources, external programming of the modulation or bias current sources, power control based on output of the laser diode, a monitor diode, and/or control based on feedback received from a monitor within the TOSAs 406.

The multiplexed optical signal is received from the second end 403 of the optical fiber 401 by the WDD 408 of the second interface 405. The WDD 408 separates the individual wavelengths transmitted, and guides the separate optical TMDS signals to the appropriate one of the ROSAs 409. Each of the ROSAs 409 includes an optical receiver that converts the optical TMDS signals back to an electrical TMDS signal. The ROSAs 409 transmit the electrical TMDS signals to a TMDS receiver 422 located on the sink device 420. The TMDS receiver 422 converts the TMDS signals to video display and/or audio data signals, such as pixel data, audio data, and control data, and the data is output to a display and/or audio system of the sink device 420.

Referring now to FIG. 5, a digital optical cable 500 is shown according to another example embodiment of the present invention. According to the embodiment shown in FIG. 5, the digital optical cable 500 uses time-division multiplexing to transmit the TMDS signals across an optical fiber 501 having a first end 502 and a second end 503.

Time-division multiplexing is digital multiplexing in which two or more apparently simultaneous channels are derived from a single optical spectrum by interleaving pulses. Therefore each channel is allocated access to the optical transmission link in sequential intervals. For example, a similar method is a packet switched transmission which may be particularly advantageous in HDMI optical cables. The first interface 504 includes a time division multiplexer (TDM) 506 and a TOSA 507. The second interface 505 includes a ROSA 508 and a time division demultiplexer (TDD) 509.

The TOSA 507 can receive a drive current from a laser driver 530. The laser driver 530 can be the simplified laser driver illustrated in FIG. 3B. The laser driver 530 can include a bias source and a modulation source. The bias source can have a single constant current bias point for all laser diodes. The modulation current source can have a single temperature coefficient for all laser diodes. The laser driver 530 can exclude, for example, any one of temperature compensation of the modulation or bias current sources, external programming of the modulation or bias current sources, power control based on output of the laser diode, a monitor diode, and/or control based on feedback received from a monitor within the TOSA 507.

In operation, the source controller 541 of the digital source device 540 produces data signals (e.g. pixel, audio, and/or control data signals). The data signals are transmitted to the TMDS transmitter 542, which converts the data signals into the TMDS data signal format. The TMDS transmitter 542 transmits the TMDS data signals to the TDM 506. The TDM 506 receives the TMDS signals and interleaves the signals for sequential transmission to the TOSA 507. The TOSA 507 receives the interleaved signals, converts the electrical signals transmitted from the TDM 506 into optical signals, and transmits the optical signals to the optical fiber 501.

The optical signals are received by the ROSA 508 of the second interface 505. The ROSA 508 includes an optical receiver that converts the optical signals back to electrical signals and transmits the electrical signals to the TDD 509. The TDD 509 separates the received electrical signals transmitted into TMDS signals (e.g. based on a field) and transmits the separate TMDS signals to the TMDS receiver 522 located at the digital sink device 520. The TMDS receiver 522 converts the TMDS signals into video and/or audio data signals, and the data signals are output to the display and/or audio system of the digital sink device 520.

Referring now to FIG. 6, a bidirectional digital optical/electrical cable 600 is shown according to another example embodiment of the present invention. The digital optical/electrical cable 600 comprises an optical fiber 601 having a first end 602 and a second end 603, and an electrical link (e.g. a metal wire or cable) 610 having a first end 611 and a second end 612. Both the optical fiber 601 and the electric link 610 can be encased by a plastic covering 613. A first interface 604 is coupled to both the first end 602 of the optical fiber 601 and the first end 611 of the electrical link 610. A second interface 605 is coupled to both the second end 603 of the optical fiber 601 and the second end 612 of the electrical link 610.

As shown in FIG. 6, the first interface 604 of the digital optical/electrical cable 600 is coupled to a digital source device 640, and the second interface 605 of the digital optical/electrical cable 600 is coupled to a digital sink device 620.

In operation, the TMDS signals from the TMDS transmitter 642 of the source device 640 are serialized by the serializer 606, transmitted by the TOSA 607 and received across the optical/electrical cable 600 by the ROSA 608, deserialized by the deserializer 609, and transmitted to the TMDS receiver 622 of the digital sink device 620. The optical fiber 601 can provide data signal transmission from the digital source device 640 to the digital sink device 620 in a similar fashion to that described above with reference to FIG. 3.

The TOSA 607 can receive a drive current from a laser driver 630. The laser driver 630 can be the simplified laser driver illustrated in FIG. 3B. The laser driver 630 can include a bias source and a modulation source. The bias source can have a single constant current bias point for all laser diodes. The modulation current source can have a single temperature coefficient for all laser diodes. The laser driver 630 can exclude, for example, any one of temperature compensation of the modulation or bias current sources, external programming of the modulation or bias current sources, power control based on output of the laser diode, and/or control based on feedback received from a monitor within the TOSA 607.

Figure 2:
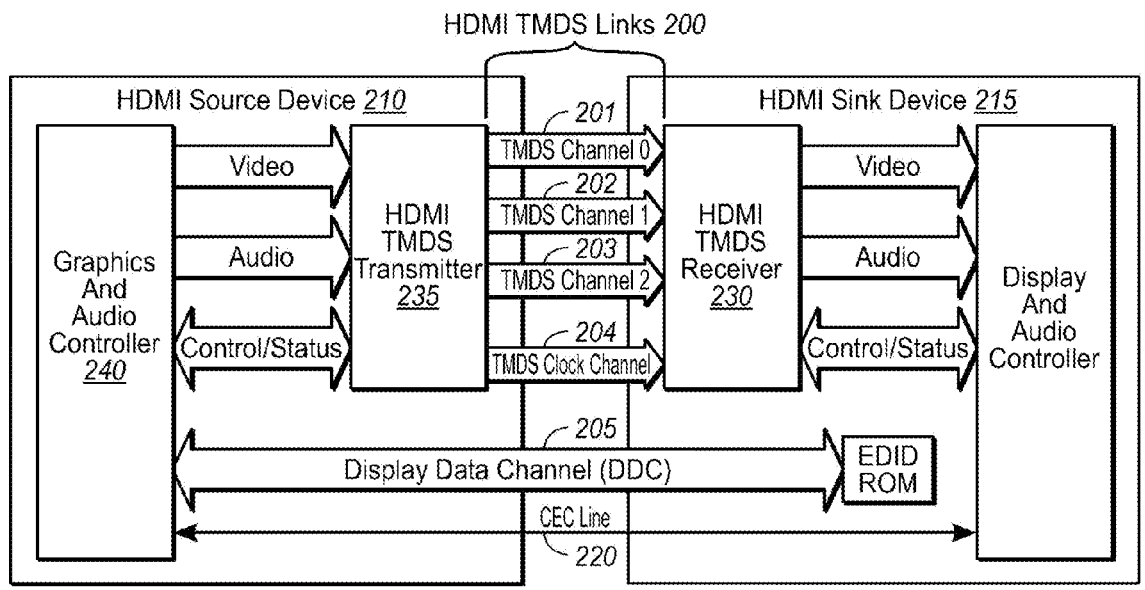
FIG. 2 illustrates the typical flow of data from the graphics and audio controller of a HDMI source to the display and audio controller of a HDMI sink.

Referring still to FIG. 6, the electrical link 610 electrically couples the sink controller 621 of the sink device 620 to the source controller 641 of the source device 640. The electrical link 610 can provide electrical communication for a return signal from the sink device 620 to the source device 640 in a direction opposite to that provided by the optical fiber 601. Bidirectional communication allows for both the source device 640 and the sink device 620 to send and receive data with each other. The electrical link 610 can also be used to provide unidirectional electrical communication or bidirectional electrical communication directions. For example, the electrical link 610 (or a plurality of electrical links) can provide electrical communication for transmission of the Display Data Channel and/or the CEC signals in an HDMI embodiment (e.g. see FIG. 2). The Display Data Channel and/or the CEC signals can also be transmitted along with the TMDS signals according to any of the embodiments described herein.

According to this example embodiment, the optical fiber 601 can be used to transfer the TMDS signals from the digital source device 640 to the digital sink device 620, in a direction where a larger bandwidth and larger transfer rate may be most advantageous. The electrical link 610 can be used to transfer a data signal in either direction in applications where the larger bandwidth and larger transfer rate may not be required. For example, the electrical link 610 may be used to send information that identifies the manufacturer and model number of the sink device 620 or the source device 640. This information may then be displayed on a screen by the digital source device 640 or the digital sink device 620. A relatively low bandwidth is needed to transmit information identifying the manufacturer and model number. Other low bandwidth signals can include various handshaking, configuration, updating of firmware or software, or control signals.

The electrical link 610 can comprise more than one electrical wire or cable for transferring data between the sink device 620 to the source device 640. For example, the electrical link 610 can be an unshielded twisted pair cable, ribbon cable, coaxial cable, etc.

According to other example embodiments, wavelength-division multiplexing and time-division multiplexing may be implemented for communication across any of the optical fibers discussed herein in a similar fashion to that described above with reference to FIG. 4 and FIG. 5.

The electrical link 610 may also transmit analog data signals between the sink device 620 and the source device 640. TDM may be used to transmit data over the electrical link 610 by interlacing packets of data in each direction with a header and fields or other means for identifying the source and/or purpose of the data in the packet payload.

Figure 7:
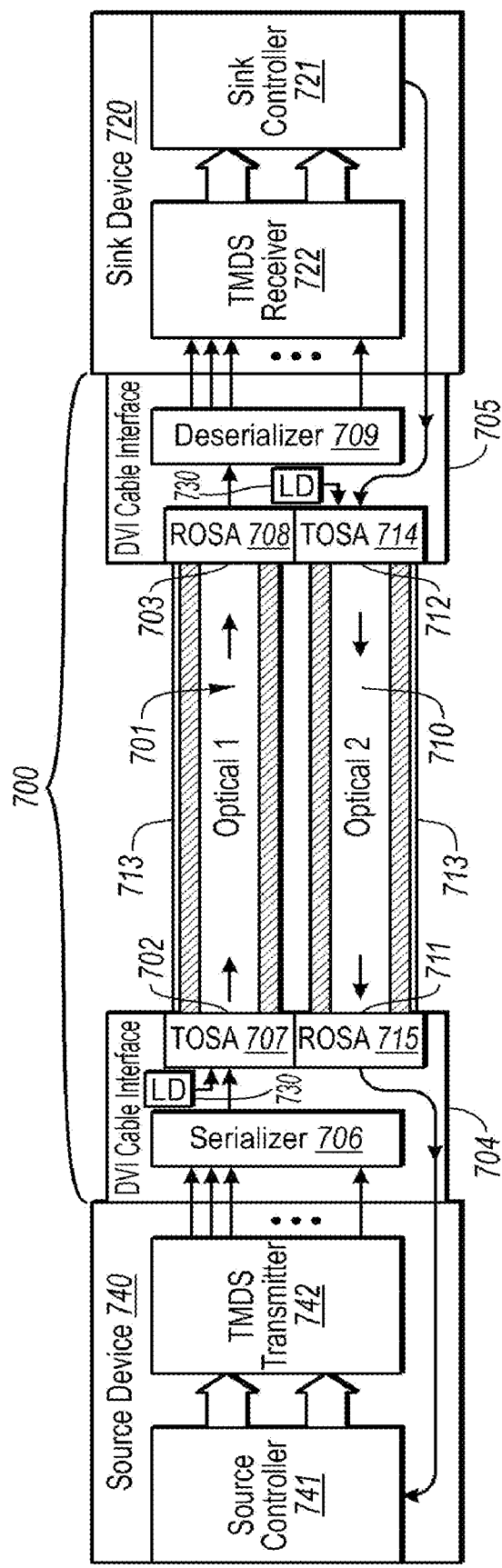
FIG. 7 illustrates a digital optical cable according to an example embodiment of the present invention.

Referring now to FIG. 7, a bidirectional digital optical cable 700 is shown according to an example embodiment of the present invention. The digital optical cable 700 comprises a first optical fiber 701 having a first end 702 and a second end 703, and a second optical fiber 710 having a first end 711 and a second end 712. Both the first optical fiber 701 and the second optical fiber 710 can be encased by a single plastic covering 713. A first interface 704 is coupled to both the first end 702 of the first optical fiber 701 and the first end 711 of the second optical fiber 710. A second interface 705 is coupled to both the second end 703 of the first optical fiber 701 and the second end 712 of the second optical fiber 710.

As shown in FIG. 7, the first interface 704 of the digital optical cable 700 is coupled to a digital source device 740, and the second interface 705 of the digital optical cable 700 is coupled to a digital sink device 720. The first optical fiber 701 is used for transmission of the TMDS signals from the source device 740 to the sink device 720. The optical fiber 701 provides data signal transmission from the source device 740 to the sink device 720 in a similar fashion to that described above with reference to FIG. 3.

The second optical fiber 710 can be used for a return data transmission in the opposite direction from the sink device 720 to the source device 740. The second interface 705 includes a TOSA 714 that receives an electrical return signal from the sink controller 721 of the sink device 720. The TOSA 714 converts the electrical return signal into an optical return signal and transmits the optical return signal onto the second end 712 of the second optical fiber 710. The first interface 704 includes a ROSA 715 that receives the optical return signal from the first end 711 of the second optical fiber 710 and converts the optical return signal into an electrical return signal. The ROSA 715 transmits the electrical return signal to the source controller 741 of the source device 740.

The TOSAs 707 and/or 714 can receive a drive current from a laser driver 730. The laser driver 730 can be the simplified laser driver illustrated in FIG. 3B. The laser driver 730 can include a bias source and a modulation source. The bias source can have a single constant current bias point for all laser diodes. The modulation current source can have a single temperature coefficient for all laser diodes. The laser driver 730 can exclude any one of temperature compensation of the modulation or bias current sources, external programming of the modulation or bias current sources, power control based on output of the laser diode, and/or control based on feedback received from a monitor within the TOSAs.

According to this example embodiment, the first optical fiber 701 can be used to transfer the TMDS signals from the source device 740 to the sink device 720, and the second optical fiber 710 can be used to transfer data in the opposite direction. This embodiment may be particularly advantageous where a larger bandwidth and larger transfer rate is desirable in both directions. It should be appreciated that the direction of data transfer can be reversed or bidirectional in any of the embodiments described herein where advantageous.

According to an example embodiment, the TOSA 707 of the first interface 704 can include a VCSEL for transmission of the optical serialized data signal onto the first optical fiber 701; and the TOSA 714 of the second interface 705 can include a LED for transmission of the return optical signal onto the second optical fiber 710. An LED may be used for the TOSA 714 of the second interface 705 when lower bandwidths are acceptable. Using an LED may also be more cost efficient than using a VCSEL. Thus, a VCSEL may be used for higher bandwidth paths, such as those sending video and/or audio data, while an LED may be used for lower bandwidth paths, such as those sending manufacturer, configuration, and model information and/or control signals.

According to other example embodiments, WDM and TDM can be implemented in either direction of the embodiment illustrated in FIG. 7 for communication across the optical fibers such as described above with reference to FIGS. 4 and 5.

Figure 8A:
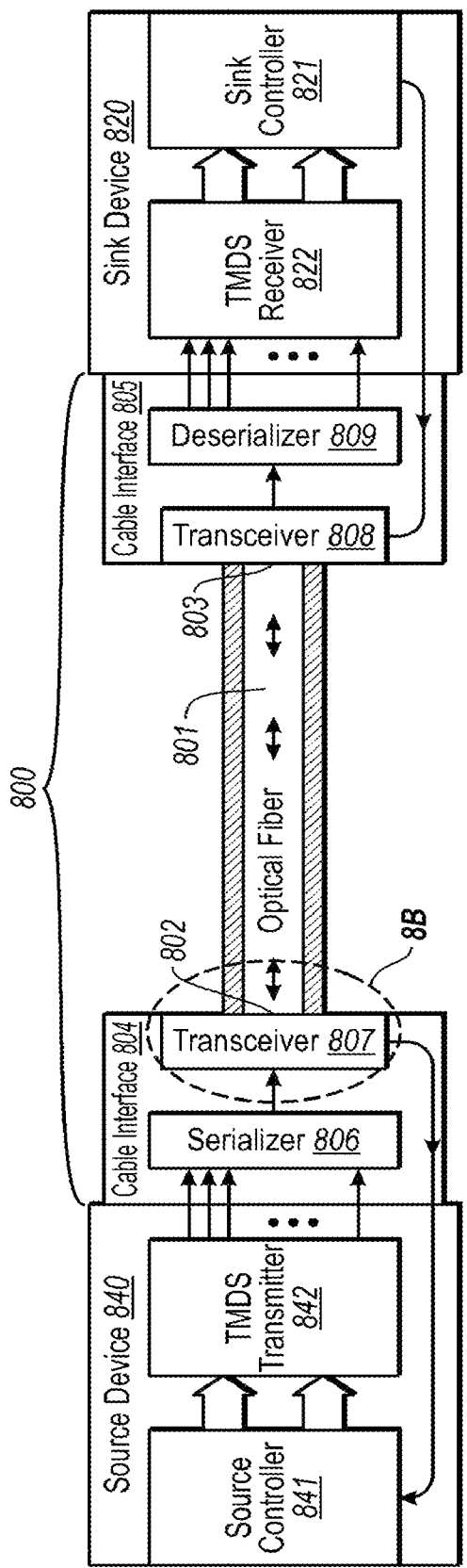
FIG. 8A illustrates a digital optical cable according to an example embodiment of the present invention.

Referring now to FIG. 8A, a bidirectional digital optical cable 800 is shown according to an example embodiment of the present invention. The digital optical cable can comprise a single optical fiber 801 having a first end 802 and a second end 803. A first interface 804 is coupled to the first end 802 of the optical fiber 801 and a second interface 805 is coupled to the second end 803 of the optical fiber 801. As shown in FIG. 8A, the first interface 804 of the digital optical cable 800 is coupled to a digital source device 840 (e.g. a DVI or HDMI source device), and the second interface 805 of the digital optical cable 800 is coupled to a sink device 820 (e.g. a DVI or HDMI source device).

According the embodiment shown in FIG. 8A, the same optical fiber 801 is used for data transmission from the source device 840 to the sink device 820, and for the transmission of a return signal in the opposite direction from the sink device 820 to the source device 840.

Figure 8B:
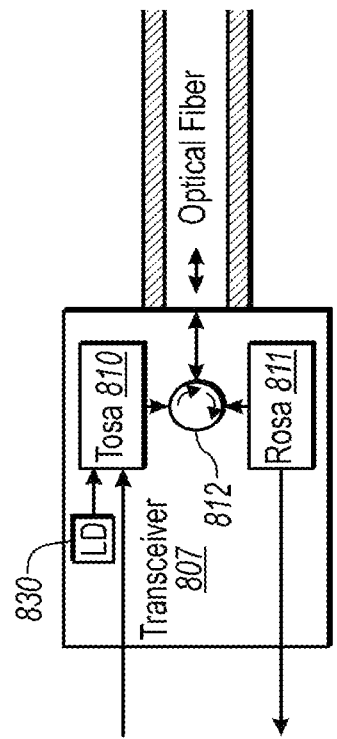
FIG. 8B illustrates a bidirectional optical transceiver for use in a digital optical cable according to an example embodiment of the present invention.

Each interface 804 and 805 can include a fiber optic transceiver 807, 808 for bidirectional optical communication. A transceiver can be both a means for converting an electrical signal to an optical signal, and also a means for converting an optical signal to an electrical signal. Several different transceiver embodiments can be implemented. FIG. 8B depicts an example embodiment of a transceiver 807. The transceiver 807 can include a TOSA 810 for sending optical signals, and a ROSA 811 for receiving optical signals. The TOSA 810 can include an optical transmitter (e.g. a laser or LED) that receives an electrical data signal, converts the electrical data signal into an optical data signal, and transmits the optical data signal onto the optical fiber 801. The ROSA 811 includes an optical receiver that receives an optical data signal from the optical fiber 801 and converts the signal to an electrical data signal. The transceiver 807 can further include an optical circulator 812 that separates transmitted and received data signals. While a particular embodiment of a transceiver 807 is shown and described, other embodiments including other optical subassemblies and components can be used to send and receive optical signals over the digital optical cable, for example as discussed below with reference to FIGS. 9-14B.

The TOSA 810 can receive a drive current from a laser driver 830. The laser driver 830 can be the simplified laser driver illustrated in FIG. 3B. The laser driver 830 can include a bias source and a modulation source. The bias source can have a single constant current bias point for all laser diodes. The modulation current source can have a single temperature coefficient for all laser diodes. The laser driver 830 can exclude, for example, any one of temperature compensation of the modulation or bias current sources, external programming of the modulation or bias current sources, power control based on output of the laser diode, a monitor diode, and/or control based on feedback received from a monitor within the TOSA 810.

According to an example embodiment, the TOSA 810 of the first interface 804 can include a VCSEL for transmission of the optical serialized data signal onto the optical fiber 801; and the TOSA 810 of the second interface 805 can include a LED for transmission of the return optical signal onto the optical fiber 801 in the opposite direction.

The optical cable 800 couples the sink controller 821 of the sink device 820 to the source controller 841 of the source device 840 for bidirectional transmission of data. The optical fiber 801 can be used to transfer the TMDS signals from the digital source device 840 to the digital sink device 820. The same optical fiber 801 can also be used to transfer return data in the opposite direction. In an HDMI embodiment, the same optical fiber 801 can be used to transfer the DDC and CEC signals. This embodiment may be particularly advantageous where a single optical fiber is desirable.

According to other example embodiments, WDM and TDM may be implemented in either direction for communication across the optical fiber 801. However, in some instances the highest speed communication may only be necessary in one direction (i.e. from the source device 840 to the sink device 820), but not necessarily in the opposite, return direction. In this case, TDM across the single optical fiber 801 may not be as advantageous because of asymmetric rates of data transfer, whereas WDM may be more advantageous.

Power for the fiber optic components can be supplied by the 5V DC power source connection located on standard cables (e.g. DVI and HDMI cables). Power for the fiber optic components may also be supplied externally, or internally, to the fiber from optic components om other exterior power sources or internal power sources.

Using an optical fiber to transmit the TMDS signals and/or other signals between a digital sink device and a digital source device can reduce the EMI fields, which is one factor that may limit the length of conventional cables using copper cables to transmit the TMDS signals. This may in some cases eliminate the need for repeaters. Fiber optic data transmission is accurate and efficient over relatively long distances that may be many times longer than that typically achieved using metal based cables to transmit TMDS signals. Fiber optic data transmission over longer distances may also be less susceptible to interference than transmission using metal based cables. Fiber optic cables may also be thinner and lighter than metal cables. Fiber optic cables may also eliminate the need for digital to analog and analog to digital conversion. Therefore, the present invention may allow for increased length of digital, video, and/or audio cables, remote placement of digital video and/or audio components, reduced hardware, and less transmission errors over those available using conventional cables using copper links.

In addition, fiber optic technology is characterized by high bandwidth and reliable, high-speed data transmission. While a typical copper based cable bandwidth may range from 22.5 Mpps to 165 Mpps, reliable fiber optic communication over a single optical fiber may be able to achieve speeds faster than the speed of a copper based digital transmission cable. As a result, digital optical cables configured in accordance with the present invention may facilitate increased bandwidth and data transfer rates over copper based digital cables. The increased bandwidth and data transfer rates in turn may facilitate the use of higher resolution or larger displays having more display pixels.

Embodiments of the present invention can comprise a TOSA including an optical package (e.g. a TO-Can package) having an optical transmitter (e.g. a VCSEL), a monitor photodiode, and a laser driver within the optical package for transmitting the optical signal to the optical fiber. Any of the optical transmitter, monitor photodiode, and laser driver may be discrete components, or may be made from a common epitaxial design. Some aspects of embodiments of the optical package are further described in U.S. Provisional Patent Application No. 60/605,781 entitled "Laser With Digital Electronic Interface" which has been incorporated by reference herein. According to an embodiment, the laser driver can be a modulation laser driver for providing a modulation current source to the laser. A bias current source may be supplied to the laser from a source external to the TOSA, such as the 5V DC power source connection located on a standard cable. The TO-Can package can be incorporated as part of the first interface and/or the second interface where a TOSA is referenced in the embodiments described above.

Embodiments of the present invention implementing bidirectional optical communication can comprise various transceiver designs. Referring again to FIG. 8A, the transceiver 807 can comprise various different subcomponents, assemblies, and configurations for sending and receiving optical signals across the single optical fiber. For example, referring to FIG. 9 a bidirectional optical assembly 910 is illustrated according to an example embodiment of the present invention. The bidirectional optical assembly 910 can be used in the digital optical cable of FIG. 8 in place of the transceiver embodiment shown in FIG. 8A for bidirectional optical communication across the optical fiber 801.

Figure 9:
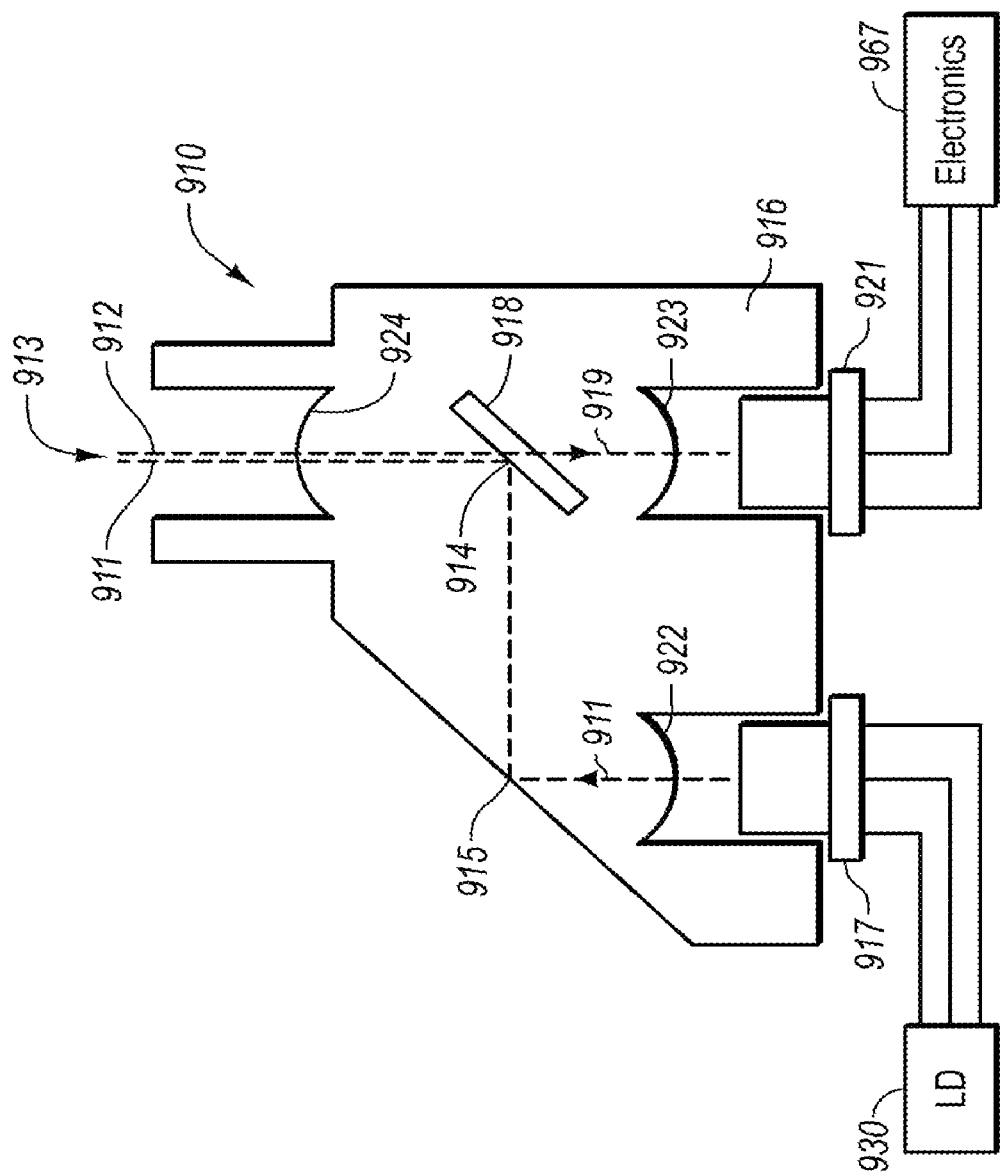
FIG. 9 illustrates a bidirectional optical transceiver for use in a digital optical cable according to an example embodiment of the present invention.

FIG. 9 is a basic diagram of a bidirectional multiband optical assembly 910. Light 911 of a first wavelength may be emitted by light source 917, which may be reflected at points 915 and 914 and exit optical port 913. Light source 917 may be a VCSEL outputting light 911 that may be modulated in one form or another with communication signals or the like. These functions may be accomplished with a laser driver 930 that is connected to source 917. Source 917 may be another kind of device as appropriate for an application of the assembly. Light 911 may have other wavelengths, besides the first wavelength, which may be filtered out by a filter or mirror.

Points 915 and 914 are where light is reflected and may be located at mirrors that are discrete or integrated parts of structure 916, such as an internal reflecting surface in the structure, or a reflective filter. Point 914 may be where filter 918 is reflective of a particular wavelength. Filter 918 may allow light 919 to pass through it from optical port 913. Light 912 may enter optical port 913 and go through a wavelength filter 918. Filter 918 may be a dichroic filter that reflects one or more wavelengths and transmits others. Filter 918 may be designed to pass light 919 of a second wavelength. All other wavelengths of light 912 are not transmitted through filter 918. Light 919 of the second wavelength may be detected by a detector 921 and converted into electrical signals. Light 919 may be modulated. Detector 921 along with an electronics module 967 may demodulate such light. Detector 921 may be a photo detector or another kind of device as appropriate for an application of the assembly. Light signals may be sent and received by device 910 simultaneously. On the other hand, components 917 and 921 may both be detectors or sources and receive or send, respectively, various signals simultaneously on different wavelengths of light, or on the same wavelength. Device 917 and/or 921 may be both a source and a detector.

Source 917 and detector 921 may be enclosed within a standard TO can (e.g. TO-5 or TO-18) as optical components. These components may electronically and packaging-wise have interfaces to standard PCBs for small form factor pluggable (SFP) modules. These components may have other forms of packaging. Alternatively, source 917 and detector 921 may be integral parts of structure 916. Lenses 922 and 923 for light source 917 and detector 921, respectively, may be molded plastic parts. The lenses also may be parts integrated into structure 916 or be molded as part of the structure. Lenses 922 and 923 may instead be part of TO can components 917 and 921, or be situated on or monolithically be a part of the laser and detector chips. Lens 924 at optical port 913 may focus incoming light to a mirror, filter, or detector in structure 916. It may also focus outgoing light to a light waveguide, such as a fiber, at optical port 913. Lens 924 may have the same structural characteristics as those of lenses 922 and 923. Lenses 922, 923 and 924 may also be used to collimate light.

Structure 916 may be a molded plastic part, made from a material such as Ultem®, or it may be an injection molded metal part or other metal housing. Structure 916 also may be made from a composite material. The TO can optical components 917 and 921 may be attached to the plastic or metal structure 916 with an epoxy or laser welding, respectively. These components are alignment tolerant. Metal rings may be attached to a plastic structure 916 for laser welding metal components to it. Dichroic filter 918 or mirror may be placed in a molded indent formed within plastic or metal structure 916 and glued in place or it may be inserted and held in place by compression. A molded groove in structure 916 may provide appropriate alignment of dichroic filter 918. Alternatively, structure 916 may be composed of two pieces glued together, one or both of which may have dichroic reflectors deposited on their surfaces.

Figure 10:
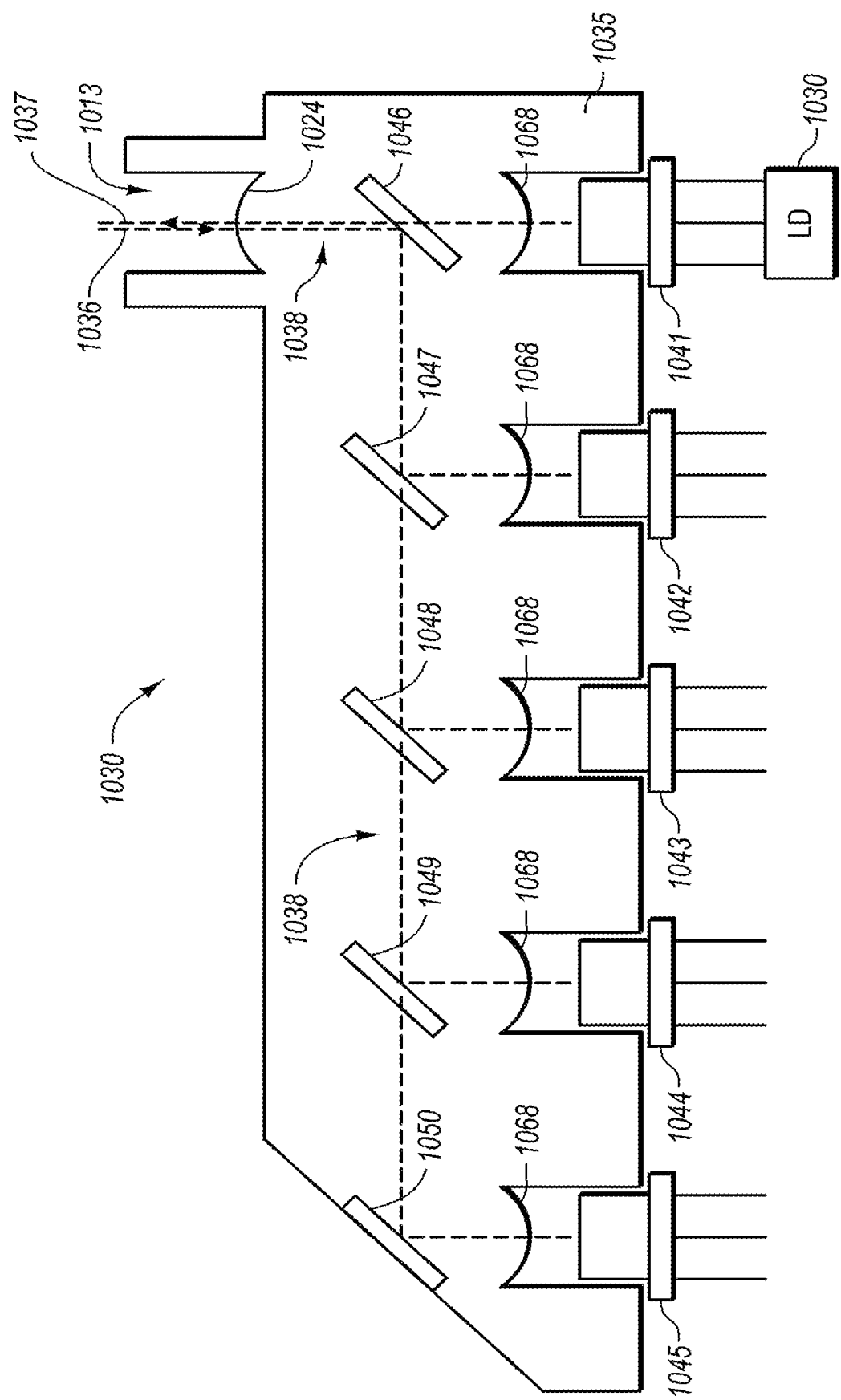
FIG. 10 illustrates a bidirectional optical transceiver for use in a digital optical cable according to an example embodiment of the present invention.

FIG. 10 shows a bidirectional optical device 1030 having a multitude of optical components, such as detectors or sources, or a mix of detectors and sources. The number of optical components is arbitrary, and may be determined by the application of device 1030 or the standard of a digital optical cable (i.e. the number of communication links in a DVI or HDMI standard). Device 1030 reveals five optical components 1041, 1042, 1043, 1044 and 1045, as an illustrative example of a structure 1035. A laser driver 1030 can be electrically coupled, or included within optical component 1041 (or any of the optical components 1041, 1042, 1043, 1044, and/or 1045. Light 1036 may arrive through port 1013 and light 1037 may exit port 1013. Light 1036 received may have a multitude of wavelengths (e.g. each representing a TMDS signal), each wavelength having communication signals different from those of other wavelengths. Similarly, light 1037 sent out may have a multitude of wavelengths (e.g. representing TMDS, or other, signals), each wavelength having communication signals different from those of other wavelengths. Light 1036 and light 1037 may be conveyed to and from optical components 1041, 1042, 1043, 1044 and 1045 by an optical mechanism 1038. Mechanism 1038 may be a light waveguide, an optical fiber, a series of mirrors, or other items to accomplish the conveyance of light 1036 and 1037 to and from the optical components. Or, mechanism 1038 might not be utilized. Lenses 1024 and 1068 may be used to focus or collimate light as appropriate. The lenses may be an integral part of structure 1035. Light 1036 and light 1037 to or from optical components 1041, 1042, 1043, 1044 and 1045 may go through filters, for example, filters 1046, 1047, 1048, 1049 and 1050, respectively. In other words, if each optical component has a wavelength different from the other optical components, there may be a filter of that wavelength associated with the respective component. For instance, optical component 1041 may send or receive light signals if a first wavelength or bandwidth (e.g. a first TMDS signal); optical component 1042 may send or receive light signals of a second wavelength or bandwidth (e.g. a second TMDS signal); optical component 1043 may send or receive light signals of a third wavelength or bandwidth (e.g. a third TMDS signal); optical component 1044 may send or receive light signals of a fourth wavelength or bandwidth (e.g. a fourth TMDS signal); and optical component 1045 may send or receive light signals of a fifth wavelength or bandwidth (e.g. a fifth TMDS signal). Similarly, filter 1046 may transmit or pass light signals only of a first wavelength or bandwidth; filter 1047 may transmit light only of a second wavelength or bandwidth; filter 1048 may transmit light of only a third wavelength or bandwidth; filter 1049 may transmit light of only a fourth wavelength or bandwidth; and filter 1050 may transmit light of only a fifth wavelength or bandwidth. All of optical components 1041, 1042, 1043, 1044 and 1045 may send light signals 1037 and/or receive light signals 1036 at the same time.

Filters 1046, 1047, 1048, 1049 and 1050 may be replaced with, for example, dichroic reflectors or other wavelength or bandwidth discriminating mechanisms. With such replacements, the optics may be adjusted for conveying light signals 1036 and 1037 to and from optical components 1041, 1042, 1043, 1044 and 1045. Structure 1035 may be made from molded plastic, for example, Ultem®, metal, composite materials or other suitable materials.

Figure 11:
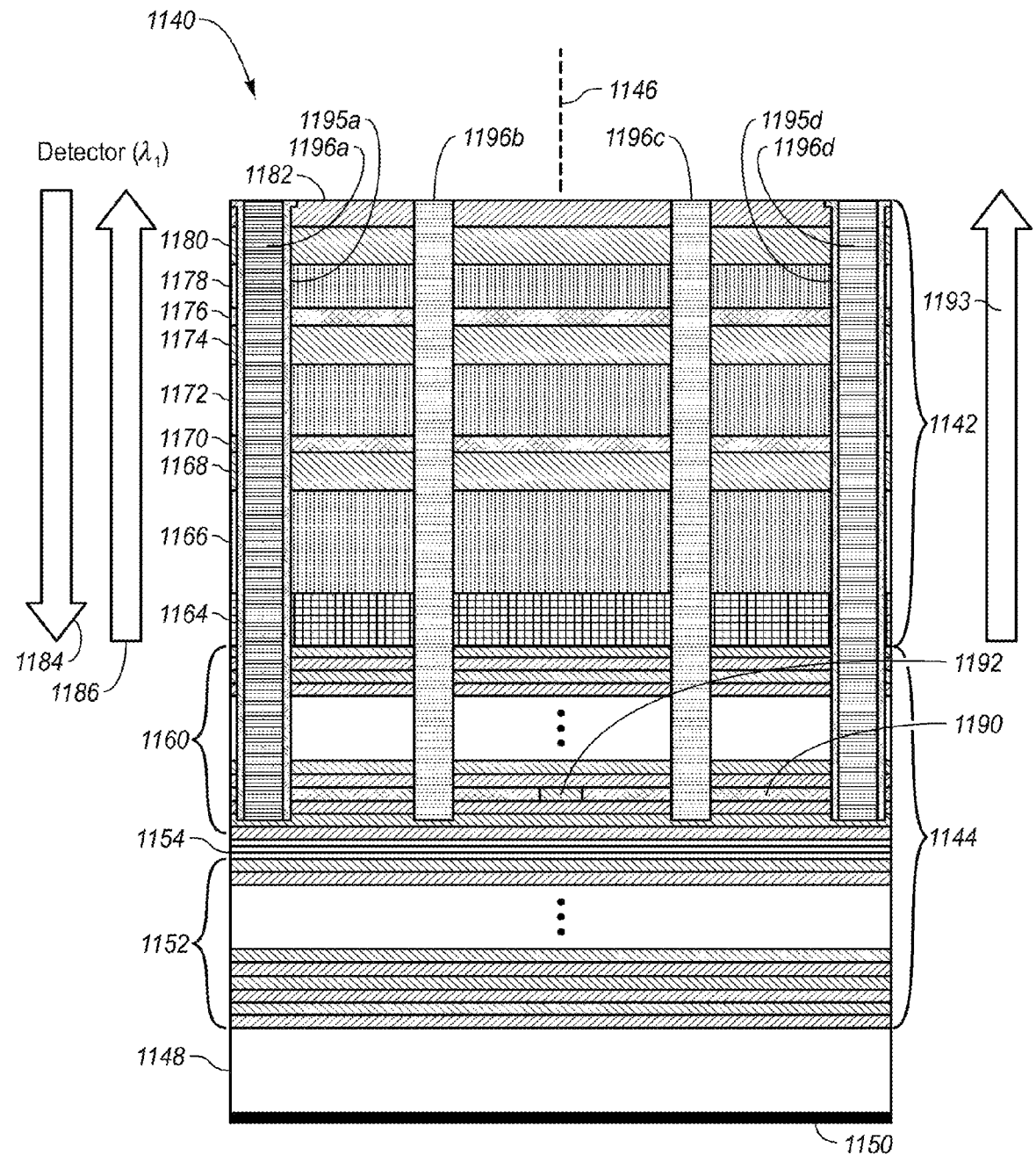
FIG. 11 illustrates a bidirectional optical transceiver for use in a digital optical cable according to an example embodiment of the present invention.

FIG. 11 is a cross-sectional side view of an illustrative optical transceiver that can be implemented in accordance with the present invention. The illustrative optical transceiver is generally shown at 1140, and includes an optical detector 1142 situated above an optical transmitter 1144, both aligned along a common optical axis 1146. The optical detector 1142 preferably absorbs a first wavelength and/or range of wavelengths, while passing a second wavelength and/or range of wavelengths. The optical transmitter 1144 preferably transmits a second wavelength and/or range of wavelengths, which passes through the optical detector 1142 and out the top of the optical transceiver 1140. In the illustrative embodiment, both the incoming light beam and the outgoing light beam pass through the top side of the optical transceiver 1140.

Although any suitable optical transmitter 1144, fabricated from any of a number of semiconductor materials may be used, the optical transmitter 1144 shown in FIG. 11 is a planar, current-guided GaAs/AlGaAs top emitting Vertical Cavity Surface Emitting Laser (VSCEL). The illustrative VCSEL 1144 is formed on an n-doped gallium arsenide (GaAs) substrate 1148, which has an n-contact layer 1150 provided on the bottom surface. An n-type mirror stack 1152 is formed on the substrate 1148. The n-type mirror stack 1152 is preferably a distributed Bragg reflector (DBR), which includes periodic layers of doped AlGaAs with alternating higher and lower aluminum fractions. An active region 1154 is shown atop the n-type mirror stack 1152. The active region 1154 preferably has a number of quantum wells, but may be any suitable active region as desired. Also, the active region 1154 may include a bottom confinement layer and a top confinement layer. A p-type mirror stack 1160 is provided on top of the active region 1154 to complete the VCSEL structure. The p-type mirror stack 1160 is preferably a distributed Bragg reflector (DBR), which includes periodic layers of doped AlGaAs with alternating higher and lower aluminum fractions. The n-type mirror stack 1152, active region 1154 and p-type mirror stack 1160 are preferably configured to produce an outgoing light beam that has the second wavelength and/or range of wavelengths.

An optical detector 1142 is provided atop the VCSEL 1144. The illustrative optical detector 1142 includes three series connected photodiodes, which are also connected in series with the VCSEL 1144. A heavily p-doped buffer layer 1164 may be provided on top of the top mirror 1160, as shown.

To form the first photodiode, a p-doped layer 1166 is provided on the heavily p-doped buffer layer 1164, followed by an n-doped layer 1168. Both the p-doped layer 1166 and the n-doped layer 1168 may be AlGaAs. The Al fraction is preferably adjusted to tune the bandgap of the layers to achieve a desired absorption cutoff wavelength, which in the illustrative embodiment, is below the emission wavelength of the VCSEL 1144.

A reverse biased tunnel junction 1170 is coupled to the first photodiode. The tunnel junction 1170 includes two highly but oppositely doped adjacent layers to create an abrupt junction that produces a narrow depletion, allowing substantial tunneling current even at relative low reverse bias voltages. In the illustrative embodiment, the bottom layer of the tunnel junction 1170 is n-type and the top layer is p-type. The n-type bottom layer makes good electrical contact with the n-doped layer 1168 of the first photodiode, and the p-type top layer makes good electrical contact with a p-doped layer 1172 of the second photodiode, which includes p-doped layer 1172 and n-doped layer 1174.

Once the tunnel junction 1170 is formed, the p-doped layer 1172 is provided, followed by an n-doped layer 1174 to form the second photodiode. The tunnel junction 1170 makes the series connection between the first photodiode and the second photodiode. Like the first photodiode, both the p-doped layer 1172 and the n-doped layer 1174 may be AlGaAs. The Al fraction is preferably adjusted to tune the bandgap of the layers to achieve the same cutoff wavelength as the first photodiode, but this is not required in all embodiments. Yet another tunnel junction 1176 is then formed, followed by a p-doped layer 1178 and an n-doped layer 1180 to form a third photodiode.

During use, an incoming light beam 1184 having a first wavelength and/or range of wavelengths is provided to the top of the optical transceiver 1140. Each of the first, second and third photodiodes is preferably tuned to absorb at least a portion of the first wavelength and/or range of wavelengths of the incoming light beam 1184. The p-type mirror stack 1160 of the VCSEL is preferably at least partially reflective at the first wavelength and/or range of wavelengths. Thus, at least part of the light that is not absorbed by the first, second and third photodiodes will be reflected back through the photodiodes, as shown at 1186. The thickness of the first, second and third photodiodes is preferably adjusted so that each photodiode absorbs approximately the same energy from the incoming light beams 1184 and 1186. In one embodiment, the thickness of the first-, second- and third-photodiodes is about 0.30, 0.27, and 0.23 microns, respectively, for an absorption wavelength of 808 microns. An upper contact layer 1182 may be provided to make electrical contact to the n-type layer 1180 of the third photodiode. One or more quarter wave oxide or nitride layers (not shown) may also be provided on top of the structure 1140 to reduce reflection and to help protect the optical transceiver 1140.

In one illustrative embodiment, and to help define the current aperture of the VCSEL 1144, one or more trenches 1196a-1196d may be etched through the first, second and third photodiodes, and in some embodiments, into the top p-type mirror stack 1160 of the VCSEL 1144. This may be accomplished with a Reactive Ion Etch (ME), but any suitable patterning method may be used. To facilitate selective lateral oxidization, one or more of the periodic layers of the top p-type DBR mirror stack 1160 of the VCSEL 1144 is provided with a higher Al concentration relative to the other periodic layers. When exposed to an oxidizing environment through the one or more trenches 1196a-1196d, layer 1190 is selectively oxidized in a lateral direction to form a current aperture 1192 for the VCSEL 1144. The extent of the lateral oxidization can be controlled by controlling the exposure time of layer 1190 to the oxidizing environment. As can be seen, the exposure time is preferably controlled so that a desired current aperture 1192 remains. In one embodiment, the current aperture 1192 of the VCSEL 1144 has a diameter of about 5-10 microns.

In the illustrative embodiment, the lateral dimension of the first, second and third photodiodes is greater than the lateral dimensions of the aperture 1192 of the VCSEL 1144. In the illustrative embodiment, the lateral dimension of the first-, second- and third-photodiodes may be on the order of 100-200 microns, while the lateral dimension of the optical cavity of the VCSEL 1144 may be on the order of 5-10 microns. When an optical fiber having a diameter of, for example, 100 microns is positioned above the optical transceiver 1140, the lateral dimension of the first-, second- and third-photodiodes may be sufficiently wide to absorb much of the incoming light beam without the need for a lens or other light concentrating element. Further, the alignment of the optical fiber to the first, second and third photodiodes may not be difficult or critical. Likewise, and because the aperture 1192 of the VCSEL 1144 is relatively small relative to the diameter of the optical fiber, much of an outgoing light beam 1193 produced by the VCSEL 1144 will be captured by the optical fiber without the need for a lens or other light concentrating element. As such, an efficient and cost effective optical transceiver 1140 may be provided.

In some embodiments, the width of the trenches 1196a-1196d may only be about 1-2 microns wide. A metal layer may then be deposited on top of the structure 1140 to fill in at least some of the trenches, such as trenches 1196a and 1196d, to make an electrical connection to the top mirror 1160 of the VCSEL 1144. To prevent the metal layer from making electrical contact with the various intermediate layers of the optical detector 1142, those trenches that are filled with the metal layer may first be lined with a dielectric layer as shown at 1195a and 1195d. As further described below, these electrical connections may be useful when it is desirable to provide the entire electrical potential produced by the series connected first, second and third photodiodes to other devices or structures.

Figure 12:
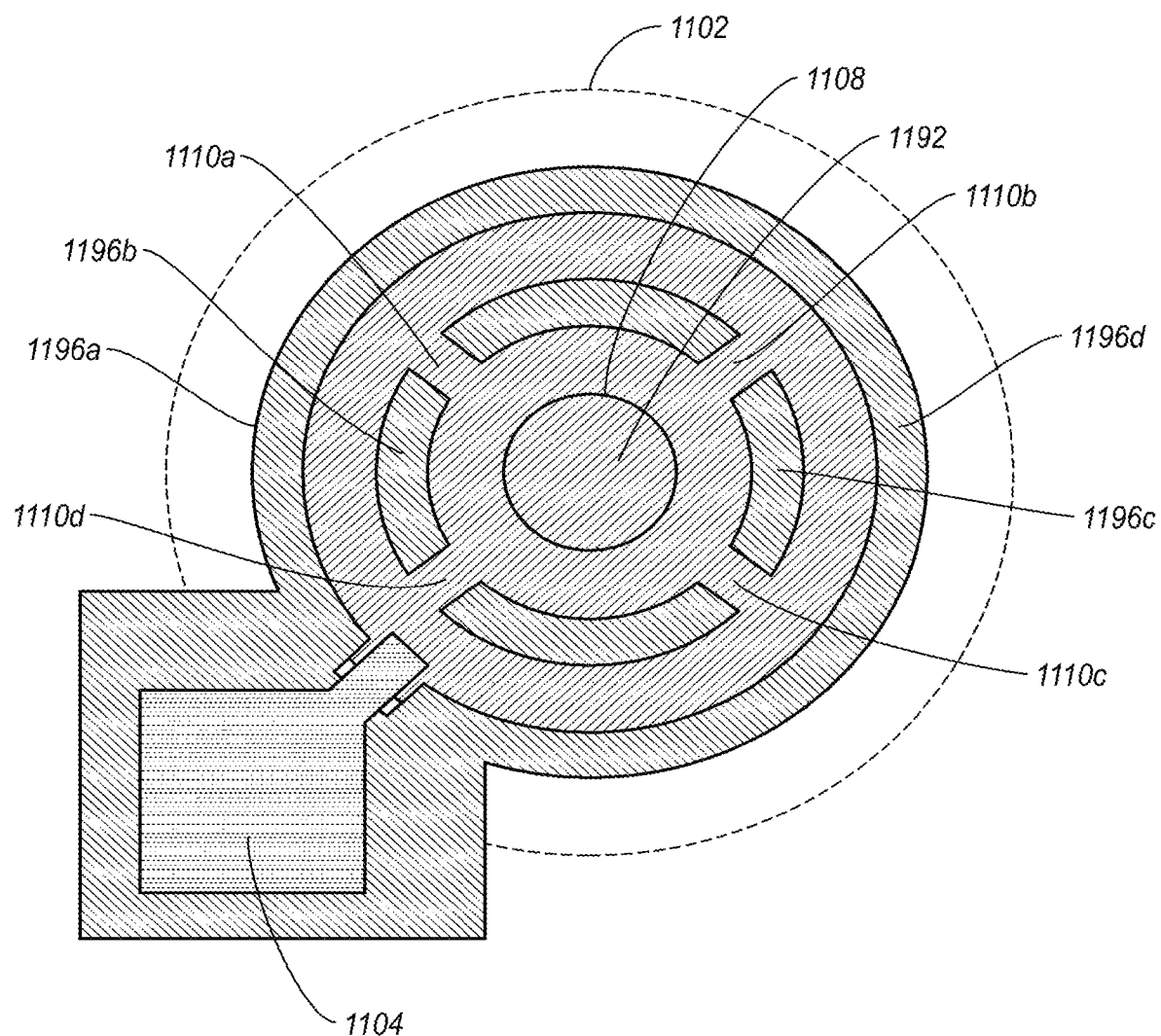
FIG. 12 illustrates a bidirectional optical transceiver for use in a digital optical cable according to an example embodiment of the present invention.

FIG. 12 is a top view of the illustrative optical transceiver of FIG. 11. FIG. 12 shows the top of the optical detector 1142 including trenches 1196a-1196d, as well as the lateral extent of the lateral oxidization of layer 1190 of VCSEL 1144. Also shown is a metal contact 1104 used to make electrical contact to the top of the optical detector 1142.

The outer boundary of the illustrative optical detector 1142 is defined by the outer trench, which is collectively shown at 1196a and 1196d. The outer trench helps electrically isolate the optical detector 1142 from other optical detectors or devices formed on the same substrate. The outer trench also helps keep the total capacitance of the optical detector 1142 down. The illustrative outer trench 1196a and 1196d is circular in shape, but other shapes may be used. The inner trench, collectively 1196b 1196c, is also circular in shape, and is spaced inward from the outer trench. The inner trench may be filled with an oxide or other dielectric, if desired.

In the illustrative embodiment of FIG. 12, the inner trench 1196b and 1196c include one or more bridges, such as bridges 1110a-1110d. Bridges 1110a-1110d provide an electrical connection between the portion of the optical detector 1142 that is situated inside of the inner trench 1196b and 1196c and the portion of the optical detector 1140 that is situated between the inner trench 1196b and 1196c and the outer trench 1196a and 1196d. When so provided, the metal contact 1104 may only extend over and make an electrical connection to the portion of the optical detector 1142 situated between the inner trench 1196b and 1196c and the outer trench 1196a and 1196d. If the bridges 1110a-1110d are not provided, a metal trace may be provided across the inner trench 1196b and 1196c to make an electrical connection to the portion of the optical detector 1142 situated inside of the inner trench 1196b and 1196c, if desired. As can be seen, the optical detector 1142 may cover a relatively larger area than the aperture 1192 of the VCSEL 1144. When the outer trench 1196a and 1196d and inner trench 1196b and 1196c are exposed to an oxidizing environment, layer 1190 of VCSEL 1144 (see FIG. 11) is selectively oxidized in a lateral direction to form a current or optical aperture 1192. The extent of the lateral oxidization is shown by dashed line 1102 and line 1108. In the embodiment shown, layer 1190 of VCSEL 1144 is oxidized outward from the outer trench to dashed line 1102 and inward from the outer trench toward the inner trench. Likewise, layer 1190 of VCSEL 1144 is oxidized outward from the inner trench toward the outer trench, and inward from the inner trench to dashed line 1108. Dashed line 1108 outlines the current aperture 1192 of the VCSEL 1144. In one embodiment, the current aperture 1192 has a diameter of about 5-10 microns, which produces a lower power VCSEL transmitter.

In some embodiments, the inner and outer trenches may be filled with an oxide or other isolation material. In other embodiments, a metal layer (not shown in FIG. 12) may be deposited down into at least part of the trenches, such as the inner and/or outer trenches 1196a-1196d, to make an electrical connection to the top mirror 1160 of the VCSEL 1144. When a metal layer is provided, a dielectric layer may first be provided to help prevent the metal layer from making electrical contact with the various intermediate layers of the optical detector 1142. As further described below, this electrical connection may be useful when it is desirable to make the entire electrical potential produced by the series connected first, second and third photodiodes available to other devices or structures. In a similar manner, and in some embodiments, appropriate trenches and metal contacts can be provided such that all three electrical contacts are separately available on the top surface, enabling, for example, flip-chip bonding to either opaque or transparent substrates.

Any of the embodiments of the present invention illustrated herein can include monolithically formed laser diodes and photodiodes. In one such embodiment, the laser diodes and photodiodes are connected through tunnel junctions such that a single power supply may be used to power the laser diodes and photodiodes. Appropriate contacts are formed to allow access to the various junctions of the laser diodes, tunnel junctions, and photodiodes. The transceiver illustrated in FIGS. 11 and 12 can receive a drive current from a simplified laser driver for closed path applications as described above.

Figure 13:
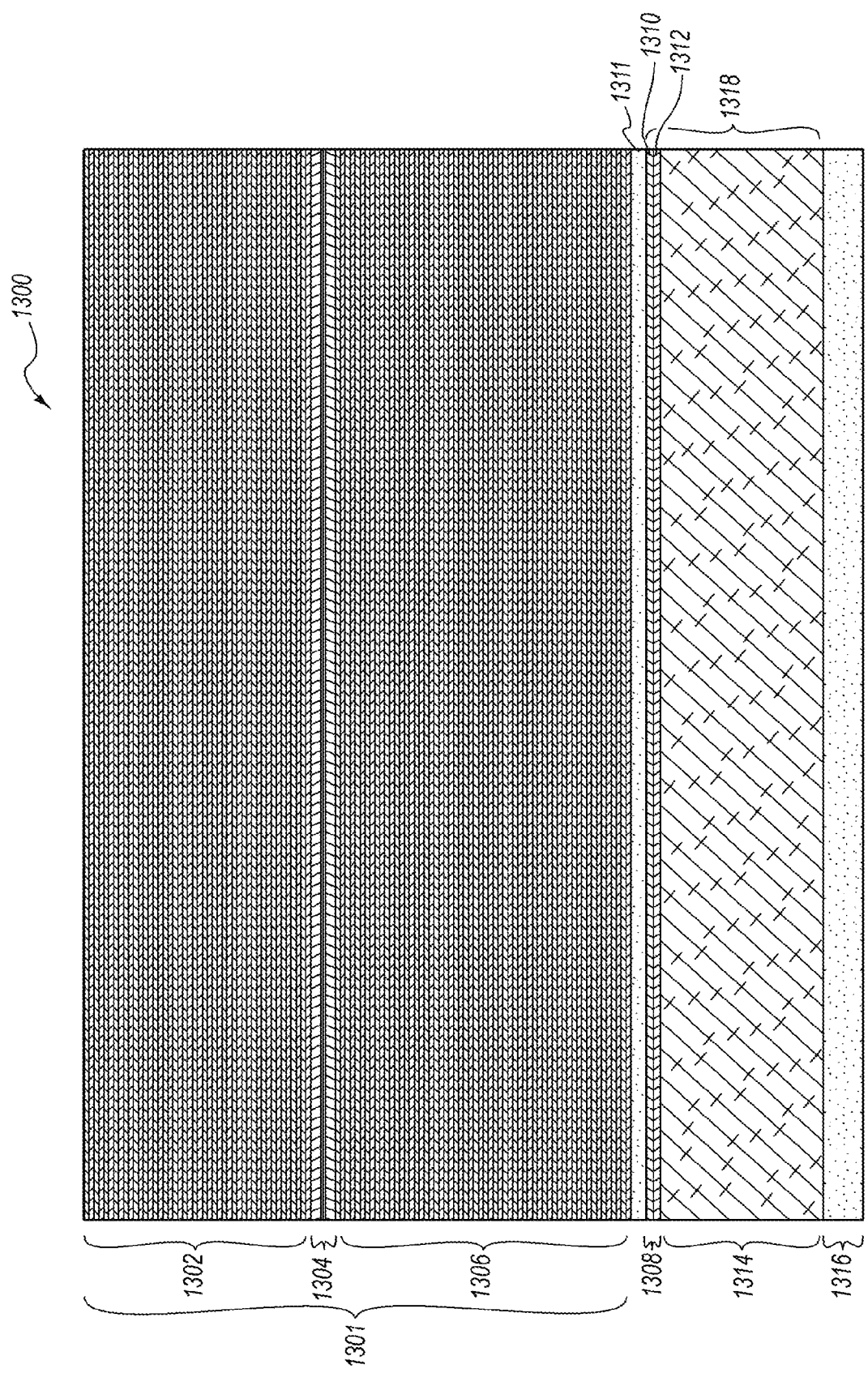
FIG. 13 illustrates a bidirectional optical transceiver with an integrated monitor photodiode for use in a digital optical cable according to an example embodiment of the present invention.

Referring now to FIG. 13, an example of an optoelectronic device, including an epitaxial structure 1300 that includes layers formed on a wafer substrate, is shown. In one embodiment, the structure 1300 is grown using a GaAs wafer. However, other III-V (three-five) semiconductor combinations may also be used. FIG. 13 shows a VCSEL 1301. The VCSEL 1301 in the example shown includes a top mirror 1302, an active region 1304, and a bottom mirror 1306. A PN junction exists in the active region 1304.

A spacer layer 1311 is formed below the bottom mirror 1306. The spacer layer 1311 is preferably about $5\lambda/4$ or $7\lambda/4$ where $\lambda$, is the wavelength of light that the VCSEL 1301 is designed to emit. The spacer layer 1311 may be any odd integral multiple of the wavelength (i.e. $\lambda(1+n)/4$ where n is an integer) that is thick enough to account for non-uniformities that may occur in various layers of the epitaxial structure 1300. The spacer layer 1311 must be sufficiently thick such that when etching is done to the spacer layer 1311 the deepest non-uniformities do not go all the way through the spacer layer 1311, and the shallowest potions reach the spacer layer 1311. The goal, therefore, is to expose the spacer layer 1311 without going all the way through the spacer layer 1311 at any point. Subsequent processing uses a selective etchant such as dilute hydrofluoric acid to uniformly expose the layer underlying the spacer.

The epitaxial structure 1300 further includes a tunnel junction 1308, formed on and electrically connected to the VCSEL 1301. The tunnel junction 1308 includes a heavily doped n+ layer 1310 and a heavily doped p+ layer 1312.

The epitaxial structure 1300 further includes a photodiode, formed on and electrically connected to the tunnel junction 1308, which includes a second p-n junction that is comprised of the heavily doped p+ type layer 1312 of the tunnel junction 1308 and a lightly doped photodiode n-type layer 1314. An additional p-type layer (not shown) that is not as heavily doped may also be fabricated between the p+ type layer 1312 and the photodiode n-type layer 1314. In one embodiment, the epitaxial structure 1300 is constructed on an n-type substrate 1316. Although the substrate 1316 is shown in FIG. 13 as a thin layer, the substrate is actually, in one embodiment of the invention, hundreds of microns whereas the epitaxial structure including the photodiode, the tunnel junction 1308, and the laser diode 1301 is about 10 microns. The epitaxial structure 1300 is generally grown using a metal organic chemical vapor phase deposition (MOCVD) process.

The top mirror 1302 is a distributed Bragg reflector (DBR) that generally comprises a number of alternating layers with high and low indexes of refraction. This creates a mirror with high reflectivity, around 99.5%. In the example shown, the top mirror is constructed of p-type materials such as carbon doped aluminum gallium arsenide (AlGaAs), where the fraction of Al can vary from 0% to 100%. The top mirror 1302 includes about 20 mirror periods where each period includes a high index of refraction layer and a low index of refraction layer.

The active region 1304 includes a number of quantum wells for stimulating the emission of laser energy. In the embodiment shown, active region 1304 is less than 1 micron.

Below the active region is a bottom mirror 1306. The bottom mirror is comprised of about 30 to 35 doped n-type mirror periods. Silicon is one example of a dopant that may be used in the bottom mirrors.

The tunnel junction 1308, as mentioned previously, includes a heavily doped n+ layer 1310 and a heavily doped p+ layer 1312. To accomplish the heavy doping, it may be desirable to create a super lattice structure. For example, instead of only GaAs layers, it may be desirable to include both layers of GaAs and InGaAs (e.g. several alternating layers) to tailor the bandgap and doping properties to improve the tunnel junction 1308. It is also desirable that the tunnel junction 1308 be somewhat transparent so as to allow optical energy to pass through to the photodiode layer 1314. This may be done in one embodiment by increasing doping on the heavily doped n+ layer 1310 so as to increase transparency through the so-called Burstein shift.

It would advantageous to balance the thickness of the heavily doped p+ layer 1312 such that appropriate conduction exists through the tunnel junction 1308 while maintaining appropriate transparency. Thus, in one embodiment of the invention, the heavily doped p+ layer 1312 is about 50 to 100 nanometers and preferably at least $3\times10^{19}$ of p-type material (e.g. when used in an 850 nm laser). The heavily doped n+ layer may be nearly any practical thickness without imposing an optical penalty.

Below the tunnel junction 1308 is a photodiode 1318. The photodiode 1318 should be constructed so as to have an appropriate responsivity to incoming light. Thus, in one embodiment of the invention, the photodiode 1318 includes a lightly doped p-layer 1314 that is approximately three microns or less when the VCSEL 1301 is designed to emit an 850 nm wavelength. One embodiment of the invention includes a lightly doped n-layer 1314 that is about 1.5 microns. Notably, the thickness of the lightly doped n-layer 1314 can be used to tailor the responsivity and speed of the photodiode. The device illustrated in FIG. 13 can receive a drive current from a simplified laser driver for closed path applications as described above.

Figure 14A:
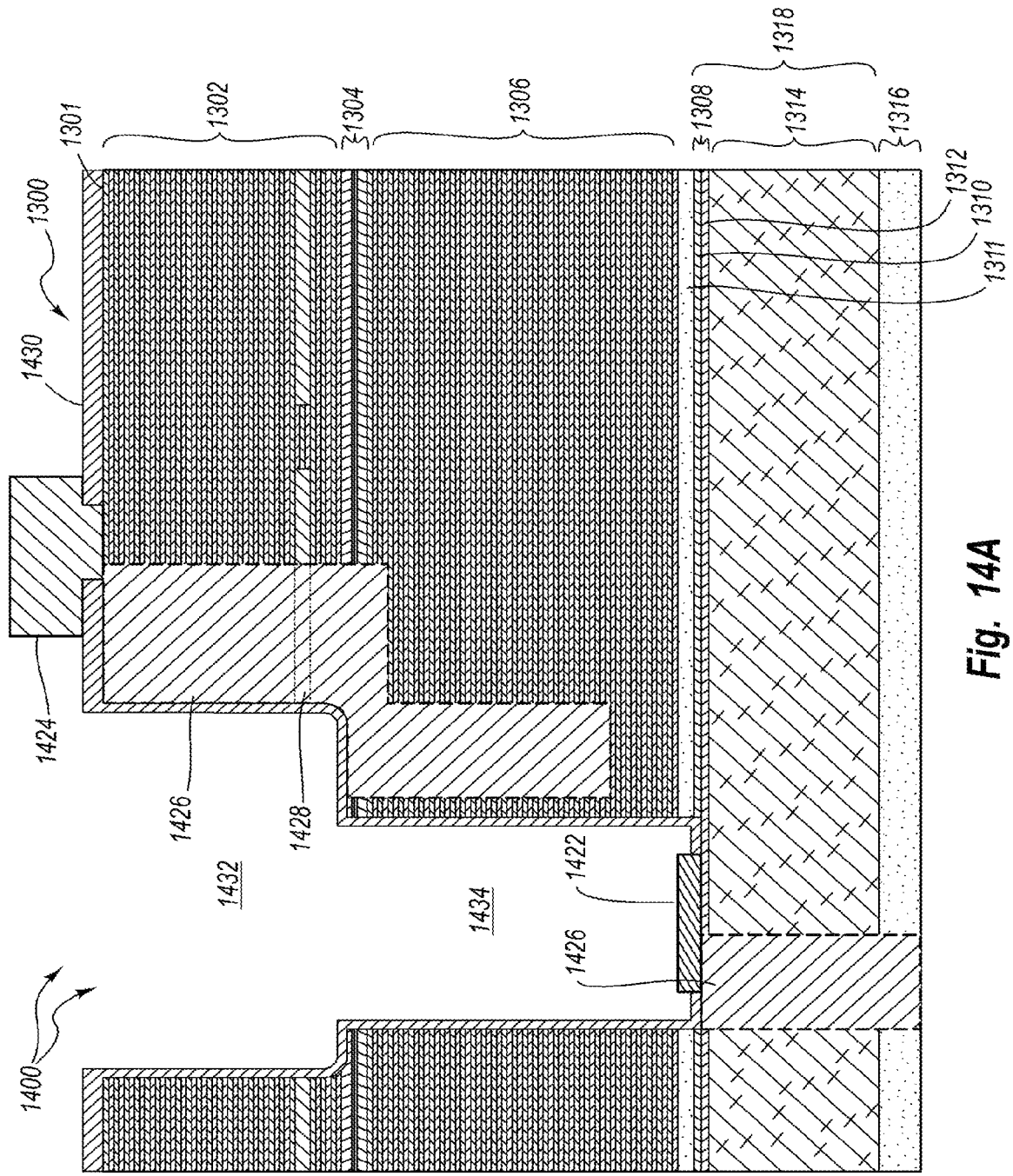
FIGS. 14A and 14B illustrate a bidirectional optical transceiver with an integrated monitor photodiode for use in a digital optical cable according to an example embodiment of the present invention.

Referring now to FIG. 14A, an embodiment is shown where contacts and oxide layers are formed through a photolithographic process. The formation of contacts allows appropriate biasing to be applied to, and signals to be read from the VCSEL 1301 and photodiode 1318. The lithographic process includes a series of acts where photoresist is applied to the epitaxial structure 1300. The photoresist is then exposed lithographically to various patterns. Lithographic exposure allows a pattern of photoresist to remain on the epitaxial structure 1300 while the remainder of the photoresist may be washed from the epitaxial structure 1300.

The patterns of photoresist that remain on the epitaxial structure 1300 block ions from being implanted in the epitaxial structure 1300, metal from being deposited on the epitaxial structure 1300, and etching solutions from etching portions of the epitaxial structure 1300. Thus, using appropriate photolithographic processes a monolithic structure 1400 that includes a VCSEL 1301, a tunnel junction 1308 and a photodiode 1318 may be constructed with appropriate contacts and with appropriate isolation from other devices on a wafer being fabricated simultaneously.

In the example shown in FIG. 14A, a tunnel junction contact 1422 is formed such that it connects to the heavily doped p-layer 1312. A VCSEL contact 1424 is formed such that it connects to the top mirror 1302 of the VCSEL 1301. Another contact may be formed on the bottom of the substrate 1316 to provide the appropriate contact to the photodiode 1318. Isolation barriers 1426 are formed to isolate the VCSEL 1301 and the photodiode 1318 from other devices being formed on the substrate 1316. An aperture 1428 is oxidized into the top mirror 1302. The aperture 1428 is used primarily to direct current flow through the VCSEL 1301.

More specifically, the optoelectronic device 1400 is fabricated from an epitaxial structure 1300. The epitaxial structure 1300 has a dielectric such as silicon dioxide or silicon nitride grown on it to form a portion of the dielectric layer 1430. A shallow trench mask is used to remove portions of the oxide using an etching process. An etch process is used to form the shallow trench 1432 in the VCSEL 1301. The aperture 1428 can then be oxidized into the VCSEL 1301.

A deep trench mask can then be used to etch the deep trench 1434. An etch can be used to etch down to a thick AlAs spacer 1311. This spacer may be AlAs or another AlGaAs composition, so long as the fraction of aluminum is substantially greater than that in the underlying layer. A stop etch may be used to etch through the AlAs spacer 1311 to the n+ layer 1310. Another etch can be used to etch through the n+ layer 1310 to the p+ layer 1312. At this point, an additional oxide may be grown that forms additional portions of the dielectric layer 1430. Portions of the dielectric layer 1430 are removed followed by deposition of metal to form contacts 1422, 1424 on the optoelectronic device 1400.

Figure 14B:
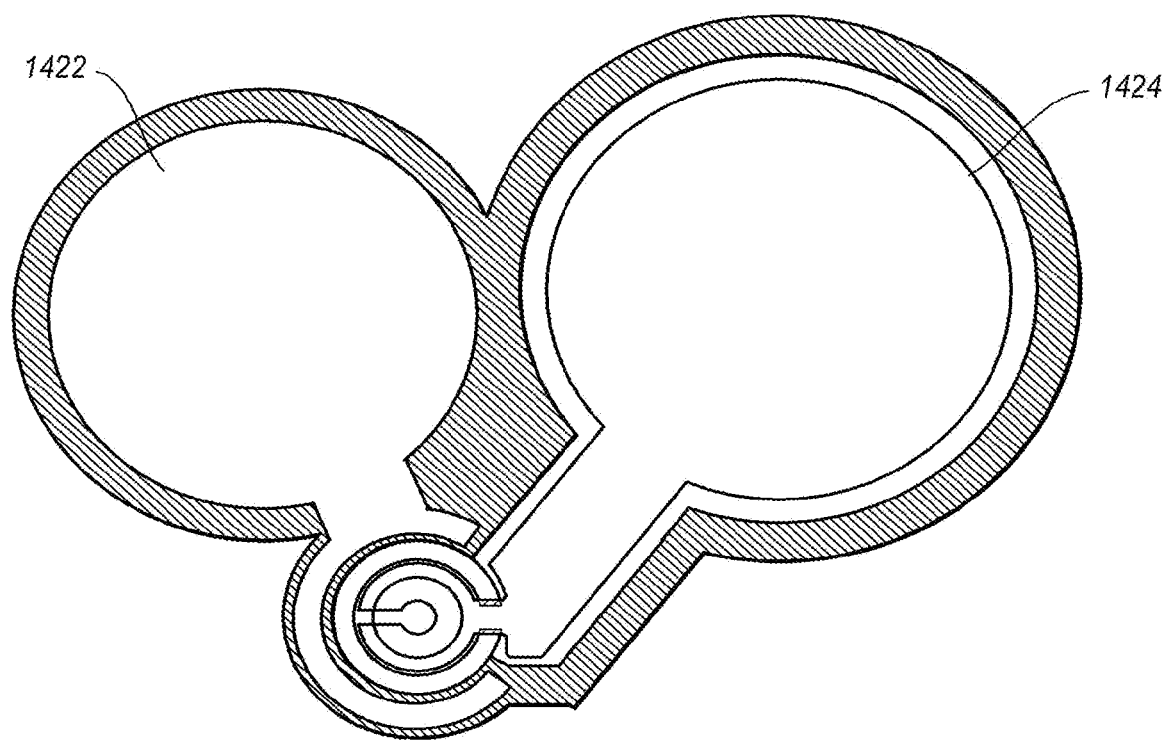

A top view of the optoelectronic device structure and contacts is shown in FIG. 14B. FIG. 14B illustrates the placement of the tunnel junction contact 1422 and the VCSEL contact 1424. While a single tunnel junction contact 1422 is shown, in other embodiments, an additional tunnel junction contact may be formed opposite the tunnel junction contact 1422 to provide for additional wire bonding options when packaging the optoelectronic device structure. The device illustrated in FIGS. 14A and 14B can receive a drive current from a simplified laser driver for closed path applications as described above.

While the present invention has been described being implemented in the DVI and HDMI standards for digital video and/or audio data transfer, the same teachings may be applied to other digital video and/or audio data transfer standards. For example, it would be apparent to one of ordinary skill in the art in view of the present disclosure how to apply the teachings of the present invention to other video data standards such as VESA, LDVS, DFP, as well as others. Such embodiments are included within the scope of the present invention.

In addition, the digital video data communication need not be conducted between the specific digital components named in this disclosure. The communication may be between any digital video and/or audio components, or consumer electronic components configured to use a digital data transfer cable.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A closed path digital optical cable comprising:
an optical fiber having a first end and a second end;
a first interface configured to couple the closed path digital optical cable to a digital source device, the first interface comprising:
an optical transmitter configured to receive a first electronic signal from the digital source device and to convert the first electronic signal to one or more optical signals, and transmit the one or more optical signals onto the first end of the optical fiber; and
a laser driver circuit configured to provide a drive current to the optical transmitter without the use of temperature compensation, the laser driver circuit having a single temperature coefficient under all operating temperatures;
a second interface configured to couple the digital optical cable to a digital sink device, the second interface comprising:
an optical receiver configured to receive the one or more optical signals from the second end of the optical fiber, convert the one or more optical signals to a second electronic signal, and transmit the second electronic signal to the digital sink device, wherein the first interface and the second interface are interconnected with the optical fiber so as to form a closed optical path.

2. The closed path digital optical cable of claim 1, wherein the laser driver circuit comprises one or more transistors, the one or more transistors including less than one hundred transistors.

3. The closed path digital optical cable of claim 2, wherein the one or more transistors include less than five transistors.

4. The closed path digital optical cable of claim 1, wherein:
the first electronic signal is one of a first plurality of transition minimized differential signaling (TMDS) signals;
the second electronic signal is one of a second plurality of TMDS signals;
the first interface further comprises a serializer circuit configured to serialize the plurality of TMDS signals into a first electrical serialized signal;
the one or more optical signals include a single optical signal;
the optical transmitter is configured to convert the first electrical serialized signal into the single optical signal and is configured to transmit the single optical signal onto the first end of the optical fiber;
the optical receiver is configured to receive and convert the single optical signal into a second electrical serialized signal; and
the second interface further comprises a deserializer circuit configured to deserialize the second electrical serialized signal into the second plurality of TMDS signals.

5. The closed path digital optical cable of claim 1, wherein the first electronic signal is one of a first plurality of transition minimized differential signaling (TMDS) signals;
the second electronic signal is one of a second plurality of TMDS signals;
the one or more optical signals comprise a plurality of optical signals of different wavelengths;
the optical transmitter is one of a plurality of optical transmitters included in the first interface;
the plurality of optical transmitters are configured to convert a corresponding one of the first plurality of TMDS signals to a corresponding one of the plurality of optical signals;
the first interface further comprises a wavelength division multiplexer (WDM) configured to receive and multiplex the plurality of optical signals into a multiplexed optical signal and to couple the multiplexed optical signal onto the first end of the optical fiber;
the second interface further comprises a wavelength division demultiplexer configured to receive and demultiplex the multiplexed optical signal from the second end of the optical fiber into the plurality of optical signals;
the optical receiver is one of a plurality of optical receivers included in the second interface;
the plurality of optical receivers are configured to convert a corresponding one of the plurality of optical signals into a corresponding one of the second plurality of TMDS signals.

6. The closed path digital optical cable of claim 1, wherein:
the first interface comprises a time division multiplexer (TDM) configured to multiplex first signals received from the digital source device in time to generate the first electronic signal prior to transmission of the first electronic signal by the optical transmitter; and
the second interface comprises a time division demultiplexer (TDD) configured to demultiplex the second electronic signal in time to generate second signals provided to the digital sink device.

7. The closed path digital optical cable of claim 1, further comprising an electrical cable having a first end coupled to the first interface and a second end coupled to the second interface, wherein the electrical cable is configured to provide electrical communication for a return signal from the digital sink device to the digital source device.

8. The closed path digital optical cable of claim 1, wherein:
the digital source device comprises a consumer electronic device, including at least one of a DVD player, a digital cable box, or a computer; and
the digital sink device comprises a consumer electronic device, including at least one of a digital television, a digital audio system, or a digital monitor.

9. A method, comprising:
providing a laser driver circuit in a first interface of closed path digital optical cable with a bias current source having a single bias current point and with a modulation current source having a single temperature coefficient under all operating temperatures;
driving, using the laser driver circuit, an optical transmitter included in the first interface to emit an optical signal representing a first electronic signal received from a digital source device coupled to the first interface without the use of temperature compensation;
emitting the optical signal onto an optical fiber coupled between the first interface and a second interface of the closed path digital optical cable;
receiving and converting the optical signal to a second electronic signal using an optical receiver included in the second interface; and
providing data included in the second electronic signal to a digital sink device coupled to the second interface.

10. The method of claim 9, further comprising:
receiving a first plurality of transition minimized differential signaling (TMDS) signals from the digital source device;

serializing the first plurality of TMDS signals into the first electronic signal prior to driving the optical transmitter to emit the optical signal representing the first electronic signal;

deserializing the second electronic signal into a second plurality of TMDS signals after receiving and converting the optical signal to the second electronic signal, wherein providing data included in the second electronic signal to the digital sink device comprises providing the second plurality of TMDS signals to the digital sink device.

11. The method of claim 9, wherein the first electronic signal is one of a first plurality of transition minimized differential signaling (TMDS) signals and the second electronic signal is one of a second plurality of TMDS signals, the method further comprising:

receiving, at the first interface, the first plurality of TMDS signals from the digital source device;

driving a plurality of optical transmitters included in the first interface to emit a plurality of optical signals representing the first plurality of TMDS signals;

wavelength division multiplexing the plurality of optical signals into a multiplexed optical signal;

coupling the multiplexed optical signal into the optical fiber;

receiving and wavelength division demultiplexing the multiplexed optical signal into the plurality of optical signals at the second interface;

providing the plurality of optical signals to a plurality of optical receivers; and converting, at the plurality of optical receivers, the plurality of optical signals into the second plurality of TMDS signals, wherein providing data included in the second electronic signal to the digital sink device comprises providing the second plurality of TMDS signals to the digital sink device.

12. The method of claim 9, further comprising:

receiving a first plurality of transition minimized differential signaling (TMDS) signals from the digital source device;

multiplexing the first TMDS signals in time to generate the first electronic signal; and demultiplexing the second electronic signal in time to generate a second plurality of TMDS signals, wherein providing data included in the second electronic signal to the digital sink device comprises providing the second plurality of TMDS signals to the digital sink device.

13. A closed path digital optical cable comprising:

an optical fiber;

a first interface configured to couple the closed path digital optical cable to a digital source device and configure to communicate bidirectionally over the optical fiber, the first interface comprising:

an optical transmitter;

an optical receiver; and a laser driver circuit comprising a bias current source with only one bias current point and a modulation current source with only one temperature coefficient under all operating temperatures such that the laser driver circuit provides a drive current to the optical transmitter without the use of temperature compensation;

a second interface configured to couple the digital optical cable to a digital sink device and configured to communicate bidirectionally over the optical fiber with the first interface.

14. The closed path digital optical cable of claim 13, wherein the first interface comprises a transceiver, the transceiver comprising:

a transmit optical subassembly (TOSA) including the optical transmitter;

a receive optical subassembly (ROSA) including the optical receiver; and an optical circulator configured to route outbound optical signals from the TOSA to the optical fiber and configured to route inbound optical signals from the optical fiber to the ROSA.

15. The closed path digital optical cable of claim 13, wherein the first interface comprises a bidirectional multiband optical assembly including the optical transmitter and the optical receiver, the bidirectional multiband optical assembly further comprising:

a wavelength splitter; and an optical port aligned to communicate optical signals between the optical fiber and the wavelength splitter, wherein:

the optical transmitter is positioned to emit optical signals along a first optical path to the wavelength splitter;

the optical receiver is positioned to receive optical signals along a second optical path from the wavelength splitter;

the wavelength splitter is configured to reflect optical signals having a first wavelength transmitted along the first optical path from the optical transmitter to the optical port; and the wavelength splitter is further configured to pass therethrough optical signals having a second wavelength from the optical port to the optical receiver along the second optical path.

16. The closed path digital optical cable of claim 13, wherein:

the optical transmitter and the optical receiver are monolithically integrated in a single semiconductor device, the optical transmitter and the optical receiver being positioned along the same optical axis;

the optical transmitter is configured to emit optical signals having a first wavelength or range of wavelengths;

the optical receiver is configured to absorb optical signals having a second wavelength or range of wavelengths; and at least one of:

the optical receiver is transparent to optical signals having the first wavelength or range of wavelengths; or the optical transmitter is transparent to optical signals having the second wavelength or range of wavelengths.

17. The closed path digital optical cable of claim 16, wherein the optical receiver comprises a plurality of photodiodes formed one on top of another, and wherein a thickness of each of the plurality of photodiodes is such that each of the plurality of photodiodes is configured to absorb approximately the same amount of energy from optical signals having the second wavelength or range of wavelengths.

18. The closed path digital optical cable of claim 17, wherein:

the plurality of photodiodes includes a first photodiode formed above the optical transmitter, a second photodiode formed above the first photodiode, and a third photodiode formed above the second photodiode;

the first photodiode is 0.30 microns thick;

the second photodiode is 0.27 microns thick; and the third photodiode is 0.23 microns thick.

19. The closed path digital optical cable of claim 16, wherein in a plane normal to an optical axis of the single semiconductor device, the optical receiver has a diameter between about 100 microns and about 200 microns and the optical transmitter has an optical cavity with a diameter between about 5 microns and about 10 microns.

20. The closed path digital optical cable of claim 16, wherein:
- the optical transmitter comprises a first p-n junction with a first p-layer and a first n-layer;
- the single semiconductor device includes a tunnel junction monolithically coupled to the optical transmitter, the tunnel junction comprising a heavily doped n+ layer and a heavily doped p+ layer;
- the optical receiver is monolithically coupled to the tunnel junction, the optical receiver comprising a second p-n junction.

* * * * *